(12) United States Patent
Lee et al.

(10) Patent No.: US 8,269,494 B2
(45) Date of Patent: Sep. 18, 2012

(54) PREPARING THE MAGNETIZATION STATE OF A SAMPLE FOR ALTERNATING REPETITION TIME STEADY STATE FREE PRECESSION MAGNETIC RESONANCE IMAGING

(75) Inventors: Hsu-Lei Lee, Los Angeles, CA (US); Krishna S. Nayak, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 629 days.

(21) Appl. No.: 12/396,463

(22) Filed: Mar. 2, 2009

(65) Prior Publication Data
US 2009/0256563 A1 Oct. 15, 2009

Related U.S. Application Data

(60) Provisional application No. 61/032,779, filed on Feb. 29, 2008.

(51) Int. Cl.
*G01V 3/00* (2006.01)
(52) U.S. Cl. .......................... 324/309; 324/307; 324/314
(58) Field of Classification Search .................. 324/309, 324/307, 314
See application file for complete search history.

(56) References Cited

U.S. PATENT DOCUMENTS

| | | | |
|---|---|---|---|
| 4,769,603 A | 9/1988 | Oppelt et al. | |
| 5,245,282 A * | 9/1993 | Mugler et al. | 324/309 |
| 5,541,514 A | 7/1996 | Heid et al. | |
| 6,366,090 B1 | 4/2002 | Heid | |
| 6,369,569 B1 | 4/2002 | Heid | |
| 6,404,195 B1 | 6/2002 | Deimling | |
| 6,452,387 B1 | 9/2002 | Hargreaves et al. | |
| 6,885,193 B2 | 4/2005 | Foxall | |
| 6,958,606 B2 | 10/2005 | Le Roux | |
| 7,332,908 B2 | 2/2008 | Nayak et al. | |
| 7,372,270 B2 | 5/2008 | Sung et al. | |
| 7,446,526 B2 | 11/2008 | Cunningham et al. | |
| 2005/0007112 A1 | 1/2005 | Deimling | |
| 2007/0145976 A1 | 6/2007 | Asano | |
| 2007/0257671 A1 | 11/2007 | Nayak et al. | |

OTHER PUBLICATIONS

Bloom, A.L., "Nuclear induction in inhomogeneous fields," Phys. Rev. 98(4): 1105-1111, May 15, 1955.
Can-, H.Y., "Steady-state free precession in nuclear magnetic resonance," Phys. Rev. 112: 1693-1701 (1958).
Cukur, T. et al., "Reduction of the transient oscillations in alternating-TR SSFP," Proc. Of the 15th Annual Meeting of Intl. Soc. Mag. Reson. Med. p. 3447 (2007).

(Continued)

*Primary Examiner* — Louis Arana
(74) *Attorney, Agent, or Firm* — McDermott Will & Emery LLP

(57) ABSTRACT

Techniques and systems for magnetic resonance imaging. In one aspect, preparatory pulse sequences precede alternating repetition time steady state free precession (ATR SSFP) pulse sequences to enable image acquisition before reaching a steady-state equilibrium. The design of the preparatory sequences is based on a two step process: First an oscillatory residue is expressed in terms of a window (e.g., a Kaiser-Bessel window) and scale parameters. Second the oscillatory residue is minimized to determine the scale parameters according to a desired application (e.g. ATR SSFP, optimized for fat, water, etc.) The preparation scheme described in this specification can be applied to arbitrary repetition times and RF phase cycling combinations.

31 Claims, 13 Drawing Sheets

OTHER PUBLICATIONS

Deimling, M. and O. Heid, "Magnetization prepared true FISP imaging," Proceedings of the $2^{nd}$ Annual Meeting of SMR, p. 495, San Francisco, 1994.

Hargreaves, B.A. et al., Characterization and Reduction of the Transiet Response in Steady-State MR Imaging, Magnetic Resonance in Medicine 46: 149-158 (2001).

Heid, O., "True FISP cardiac fluoroscopy," Proceedings of the $5^{th}$ Annual Meeting of Intl. Soc. Mag. Reson. Med., p. 320, Vancouver, B.C., Canada, Apr. 12-18, 1997.

Jaynes, E.T., "Matrix treatment of nuclear induction," Phys. Rev. 98(4): 1099-1105 (May 15, 1955).

Le Roux, P., "Simplified model and stabilization of SSFP sequences," Journal of Magnetic Resonance 163(1): 23-37 (2003).

Lee, H.-L., and K. S. Nayak, "A Simplified Model for Stabilizing Alternating TR SSFP sequences," Proc. 16th Meeting of ISMRM, Toronto, ON, May 2008, p. 1358.

Lee, H.-S. and K.S. Nayak, "Stabilization of alternating TR steady-state free precession sequences," Journal of Magnetic Resonance 195: 211-218 (2008).

Leupold, J. et al., "Alternating Repetition Time Balanced Steady State Free Precession," Magnetic Resonance in Medicine 55: 557-565 (2006).

Nayak, K.S. et al., "Wideband SSFP: Alternating Repetition Time Balanced Steady State Free Precession with Increased Band Spacing," Magnetic Resonance in Medicine 58: 931-938 (2007).

Nishimura, D.G. et al., "Analysis and reduction of the transient response in SSFP imagin," Proceedings of the $8^{th}$ Annual Meeting ISMRM, Denver, 2000, p. 301.

International Search Report and Written Opinion for PCT/US2009/035784 dated Jan. 8, 2010, 11 pages.

* cited by examiner

PREPARING THE MAGNETIZATION STATE OF A SAMPLE FOR ALTERNATING REPETITION TIME STEADY STATE FREE PRECESSION MAGNETIC RESONANCE IMAGING

CROSS REFERENCE TO RELATED APPLICATIONS

This document claims priority under 35 U.S.C. §119(e) to U.S. Provisional Application Ser. No. 61/032,779, entitled "Preparing a Magnetization State using Nuclear Magnetic Resonance," and filed by Hsu-Lei Lee et al. on Feb. 29, 2008, the entire disclosure of which is incorporated herein by reference.

FEDERALLY SPONSORED RESEARCH OR DEVELOPMENT

This invention was made with government support under #R21-HL079987 awarded by National Institutes of Health. The government has certain rights in the invention.

TECHNICAL FIELD

This document relates to nuclear magnetic resonance imaging (MRI).

BACKGROUND

Acquiring an image of a sample using MRI includes manipulating magnetic properties of the sample. Typically, the macroscopic sample acquires a magnetic moment when the sample is polarized along a primary axis defined by a principal magnetic field generated external to the sample. The sample reaches an essentially constant polarization state, known as a thermal equilibrium state, in the principal magnetic field. In order to acquire an image of the sample, the sample may be subject to time-varying and/or constant magnetic field gradients generated by gradient coils external to the sample. In addition, the sample may be subject to radio frequency (RF) pulses generated by RF coils external to the sample. The RF pulses, applied transverse to the primary axis defined by the external field, are used to manipulate the magnetization of the sample. Transverse components of the magnetization of the sample can induce time-varying currents in the RF coils, and the induced currents can be used to construct an image of the sample.

SUMMARY

Techniques and systems are described to provide RF pulses used to manipulate the magnetization of an MRI sample. In one aspect, preparatory pulse sequences precede alternating repetition time steady state free precession (ATR SSFP) pulse sequences to enable image acquisition before reaching a steady-state equilibrium. The design of the preparatory sequences is based on a two step process: First an oscillatory residue is expressed in terms of a window (e.g., a Kaiser-Bessel window) and scale parameters. Second the oscillatory residue is minimized to determine the scale parameters according to a desired application (e.g. ATR SSFP, optimized for fat, water, etc.) The preparation scheme described in this specification can be applied to arbitrary repetition times and RF phase cycling combinations.

In some cases, the state-preparation pulse sequence is used to achieve a steady state having properties desirable for imaging the sample. Example state-preparation sequences include alternating steady-state free precession (SSFP) sequences for fat-suppression, water suppression, reduced artifacts, and others.

In various implementations, an RF pulse sequence can be used to increase the efficiency of reaching an initial steady state for performing MRI. The RF pulse sequence may reduce or eliminate oscillations in a transient signal (e.g. due to the presence of an oscillatory residue) as the sample approaches a steady state, thus reducing the time delay needed before image acquisition.

In one aspect, a sample including nuclear spins is magnetized using a principal magnetic field to orient a portion of the nuclear spins to obtain an initial magnetization within the sample. The initial magnetization is conditioned using a preparation sequence of radio frequency (RF) pulses to reduce a transient oscillation in a select sequence of RF excitation pulses. The select sequence of RF excitation pulses is applied to the sample to flip the conditioned magnetization between a first excited state and a second excited state separated by a predetermined flip angle and a predetermined relative phase. Spatially-resolved RF emissions from the first and second excited states of the magnetization are being detected. Then, the detected spatially-resolved RF emissions are converted into an image of the sample.

In some implementations, the initial magnetization is a thermal equilibrium magnetization. In other implementations a contrast preparation scheme is applied prior to conditioning the initial magnetization to prepare the sample for a select application specific imaging. The select application specific imaging can be, for example, fat saturation or inversion recovery. In another implementation, the select sequence of RF excitation pulses includes an alternating repetition time steady-state free precession (ATR SSFP) sequence of pulses that contains different alternating repetition times between the RF excitation pulses.

In another aspect, conditioning the initial magnetization includes rotating iteratively the equilibrium magnetization through a preparatory sequence of angles that incrementally increase from zero to the predetermined flip angle. In a further aspect, conditioning the initial magnetization further can include identifying an expected transient oscillation of the first and second excited states of the magnetization. The transient oscillation is in response to turning on the select sequence of RF excitation pulses in absence of the preparation sequence of RF pulses. To compensate for the identified transient oscillation the following techniques can be used. In some implementations, a scaled window is applied to a set of incremental angles to obtain the preparatory sequence of angles. In other implementations, compensating includes separating the set of incremental angles in the following: a set of odd elements expressed in terms of Kaiser-Bessel (KB) windows multiplied by a first scale parameter, and a set of even elements expressed in terms of KB windows multiplied by a second scale parameter. The first and second scale parameters can be obtained to add to 1 and to eliminate at least some of the transient oscillation. The first and second scale parameters are based on phase offsets of the first and second excited states of the magnetization, and are independent of the predetermined flip angle.

In another implementation, identifying the expected transient oscillation includes obtaining a component of a transient magnetization based on an oscillatory residue that contains a linear combination of the set of incremental angles. The linear combination includes coefficients that depend on phase offsets of the first and second excited states of the magnetization, and are independent of the predetermined flip angle. The component of the transient magnetization is perpendicular to the first and second excited states of the magnetization.

In another aspect, the magnetic resonance imaging (MRI) system is described. The MRI system includes a magnet to magnetize a sample in a uniform magnetic field to orient a portion of nuclear spins to obtain an initial magnetization within the sample. The MRI system also includes a controller to obtain a preparation sequence of radio frequency (RF) pulses to reduce a transient oscillation in a select sequence of RF excitation pulses.

The MRI system contains a radio frequency (RF) transceiver in communication with the controller to perform multiple operations. The RF transceiver conditions the initial magnetization using the preparation sequence of RF pulses, and applies a select sequence of RF excitation pulses to flip the conditioned magnetization between a first excited state and a second excited state separated by a predetermined flip angle and a predetermined relative phase. The RF transceiver also detects spatially-resolved radio frequency emissions from the first and second excited states of the magnetization.

The controller of the MRI system is configured to convert the detected radio frequency emissions into an image of the sample.

In some implementations of the MRI system, the initial magnetization is a thermal equilibrium magnetization. The controller of the MRI system can be configured to apply a contrast preparation scheme to condition the initial magnetization to prepare the sample for a select application specific imaging. The RF transceiver of the MRI system applies the contrast preparation scheme prior to conditioning the initial magnetization. The select application specific contrast preparation can include fat saturation or inversion recovery.

In another implementation, the MRI system includes an RF transceiver to condition the initial magnetization. The RF transceiver iteratively rotates the equilibrium magnetization through a preparatory sequence of angles that incrementally increase from zero to the predetermined flip angle. The select sequence of RF excitation pulses includes an alternating repetition time steady-state free precession (ATR SSFP) sequence of pulses including different alternating repetition times between the RF excitation pulses. In some implementations, a first pulse of the ATR SSFP sequence of RF pulses coincides to the last pulse of the sequence of preparatory RF pulses. In yet other implementations, the sequence of preparatory RF pulses contains an even number of pulses, for example, 8 pulses. The preparation sequence of RF pulses may also include the repetition times of the select sequence of RF excitation pulses.

In another aspect, the MRI system controller is configured to determine the preparatory sequence of angles. To determine the preparatory sequence of angles, the controller obtains the amplitudes of a set of incremental angles selected by applying a window scaled based on scale parameters. The applied window can be a Kaiser-Bessel window.

In yet another aspect, the controller identifies an expected transient oscillation of the first and second excited states of the magnetization. The transient oscillation occurs in response to turning on the select sequence of RF excitation pulses in absence of the preparation sequence of RF pulses. The controller then compensates for the identified transient oscillation. For example, a scaled window can be applied to a set of incremental angles to obtain the preparatory sequence of angles. In some implementations, the controller is configured to compensate for the identified transient oscillation using a set of incremental angles separated in a set of odd elements expressed in terms of KB windows multiplied by a first scale parameter, and another set of even elements expressed in terms of KB windows multiplied by a second scale parameter. The first and second scale parameters obtained to add to 1 and are calculated to eliminate at least some of the transient oscillation. The first and second scale parameters are based on phase offsets of the first and second excited states of the magnetization, and are independent of the predetermined flip angle.

The MRI system controller is further configured to identify the expected transient oscillation. A component of a transient magnetization obtained based on an oscillatory residue includes a linear combination of the set of incremental angles. The linear combination also contains coefficients that depend on phase offsets of the first and second excited states of the magnetization, and are independent of the predetermined flip angle. Also, the component of the transient magnetization is perpendicular to the first and second excited states of the magnetization.

In other implementations, the select sequence of RF excitation pulses can be a wideband steady-state free precession (SSFP) pulse sequence. The predetermined relative phase for this pulse sequence is $\pi$. The controller is configured to determine the set of incremental angles for the wideband SSFP sequence as a center of passband set to zero to calculate the first and second scale parameters. Also, the set of incremental angles are obtained as an alternating scaled KB window, while scale is set by a ratio of the calculated first and second scale parameters.

In another implementation, the select sequence of RF excitation pulses can be a fat suppressed ATR SSFP (FS-ATR SSFP) pulse sequence to eliminate fat from an image. The predetermined relative phase is different from $\tilde{0}$ and $\pi$. The controller is configured to determine the set of incremental angles for the FS-ATR SSFP sequence to not image fat as a center of stopband set to $\pi/2$ to calculate the first and second scale parameters. In this example, the second scale parameter is obtained to equal to zero, and the set of incremental angles is obtained to include a KB window including odd elements.

In yet another implementation, the select sequence of RF excitation pulses can contain an FS-ATR SSFP pulse sequence to image water, wherein the predetermined relative phase is different from 0 and $\tilde{\pi}$. The controller is configured to determine the set of incremental angles for the FS-ATR SSFP pulse sequence to image water as a center of passband set to $-\pi/2$ to calculate the first and second scale parameters. In this implementation, the second scale parameter obtained to equal to the first scale parameter; and the set of incremental angles obtained to include a KB window including odd and even elements.

In another implementation, the RF transceiver of the MRI system is configured to detect radio frequency emissions from the first and second excited states of the magnetization and to simultaneously apply the select sequence of RF excitation pulses.

In yet another aspect, a method for nuclear magnetic resonance imaging (MRI) is described. The method includes magnetizing a sample containing nuclear spins. A principal magnetic field is used to orient a portion of the nuclear spins. A sequence of N radio frequency pulses is applied to the sample. A time delay after each pulse is set such that the time delay alternates between a first time duration TR1 and a second time duration TR2. A first subset of radio frequency pulses including an N/2 radio frequency pulses is prepared such that a pulse can be applied after each of the time delays having the duration TR1. A second subset of radio frequency pulses including an N/2 radio frequency pulses is prepared such that a pulse can be applied after each of the time delays having the duration TR2.

The method further includes rotating, at each of the N radio frequency pulses, at least a portion of the sample magnetization by a rotation angle determined at least in part by parameters of the pulse. The sequence of N radio frequency pulses corresponds to a sequence of N rotation angles, the first subset of radio frequency pulses corresponds to a subset of N/2 rotation angles, the second subset RF pulses corresponds to another subset of N/2 rotation angles. The sequence of N rotation angles is based in part on a Kaiser-Bessel window function and scaled according to scale values, the first subset of rotation angles are scaled by a first scale value (b1), and the second set of rotation angles are scaled by a second scale value (b2) unequal to the first scale value.

In yet another aspect, instructions stored tangibly in a machine-readable medium, for causing one or more hardware components of a magnetic resonance imaging system to perform multiple operations are also described.

In one implementation, the operations include generating a sequence of N radio frequency pulses including a time delay before each pulse, with the time delay alternating between a first time duration TR1 and a second time duration TR2. The sequence of N radio frequency pulses is parameterized to correspond to a sequence of N rotation angles of a component of a magnetization of a sample. The sequence of N rotation angles is based in part on a Kaiser-Bessel window function and scaling values. Further, the N/2 radio frequency pulses applied after each of the time delays having the first time duration TR1 are scaled by a first scaling value, and the N/2 radio frequency pulses applied after each of the time delays having the second time duration TR2 are scaled by a second scaling value unequal to the first scaling value.

The techniques, apparatus and systems described in this document can optionally provide one or more of the following advantages. The ATR SSFP sequences based on Kaiser-Bessel window function can prepare an effective magnetization state for fat saturation or inversion recovery. Additionally, the Kaiser-Bessel window keeps transient oscillations suppressed for a wide range of frequencies.

BRIEF DESCRIPTION OF DRAWINGS

These and other aspects will now be described in detail with reference to the following drawings.

Like reference symbols in the various drawings indicate like elements.

DETAILED DESCRIPTION

A balanced steady-state free precession (SSFP) signal may oscillate when the magnetizations approach steady state from thermal equilibrium. The fluctuating signal may create varying weighting in different k-space locations, which can result in substantial image artifacts. The duration of these transient oscillations is on the order of the T1 relaxation time. Simply waiting for the steady-state to be reached may compromise the effectiveness of magnetization preparation schemes (e.g. fat saturation or inversion recovery) that are essential in many SSFP applications. Therefore, an efficient initial preparation scheme is desirable in non-continuous scans, such as the scans based on balanced SSFP sequences.

For balanced SSFP, there is a Fourier relation between RF flip angle increment and the resulted oscillatory residues. A Kaiser-Bessel windowed ramp catalyzation approach can be used to achieve a smooth and rapid SSFP signal transition. Alternatively, a paired Kaiser-Bessel pulse sequence can be used to obtain a performance comparable to the foregoing transform performance when enough RF train length (or a sufficient number of preparation cycles) is allowed.

The current specification describes techniques and systems to prepare a magnetization state for alternating TR SSFP (e.g., fat-suppressed ATR-SSFP, wideband SSFP) sequences. The following notations are used throughout this specification: TR stands for Repetition Time; ATR stands for Alternating Repetition Time; and FS stands for fat-suppressed. Accordingly, fat-suppressed ATR-SSFP is abbreviated FS-ATR SSFP.

ATR SSFP pulse sequences can be used to achieve a more sensitive frequency response compared to balanced SSFP pulse sequences. In the case of FS-ATR SSFP, a wide stop-band can be achieved to suppress fat in the steady state. In this specification, preparatory pulse sequences are designed to reduce oscillatory residues during the transient approach to steady state. The preparatory pulse sequences precede ATR-SSFP imaging in order to enable image acquisition before reaching a steady-state equilibrium. The design of the preparatory sequences is based on a two step process: first an oscillatory residue is expressed in terms of a windowing function (preferably a Kaiser-Bessel window) and scale parameters, second the oscillatory residue is minimized to determine the scale parameters according to a desired application (e.g., FS-ATR SSFP optimized for fat, water, etc.) The preparation scheme described in this specification can be applied to arbitrary TR1/TR2 and RF phase cycling combinations.

Figure 1:
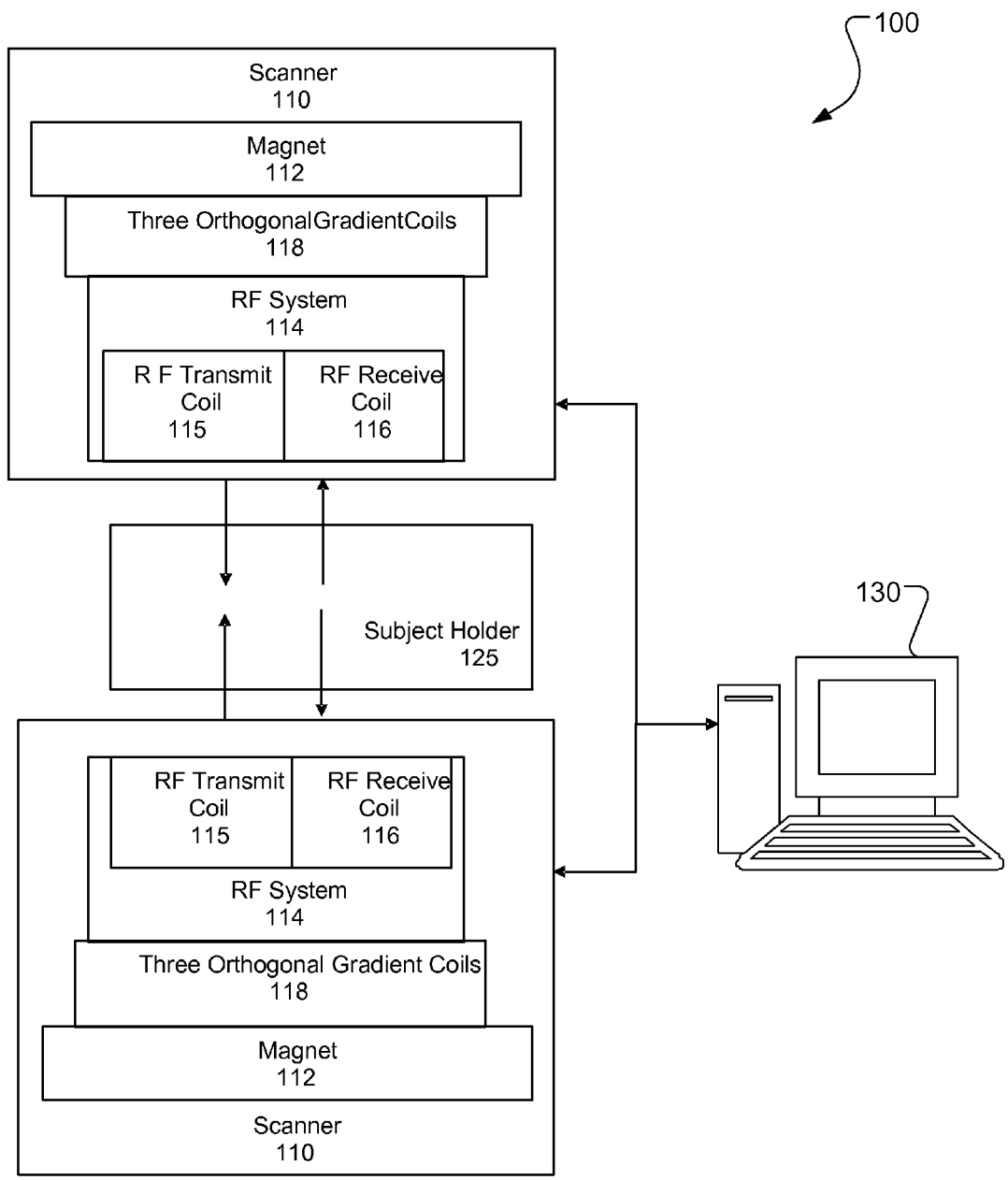
FIG. 1 represents a schematic representation of a magnetic resonance imaging system.

FIG. 1 illustrates an example magnetic resonance imaging (MRI) system 100 for implementing the techniques described in this document. Techniques as disclosed in this specification can be implemented using the MRI system 100. The MRI system 100 can be implemented using any one of various MRI scanners such as a Signa Excite HD 3T scanner with a single-channel head coil (available from GE Healthcare Technologies, Milwaukee, Wis.) The MRI system 100 includes a scanner 110, a data processing apparatus 130 and a subject holder or table 125 for holding a subject 120. The scanner 110 includes a main magnet 112, three orthogonal gradient coils 118 and a RF system 114. The main magnet 112 is designed to provide a constant, homogeneous magnetic field. The three orthogonal gradient coils 118 are designed to provide three orthogonal, controller magnetic gradients used to acquire image data of a desired slice by generating an encoded and slice-selective magnetic field. The RF system 114 includes a RF transmit coil 115 and a RF receive coil designed to transmit and receive RF pulses. The RF system 145 can further include a RF synthesizer (not shown) and a power amplifier (not shown). In some implementations, an integrated transceiver coil (not shown) can be implemented instead of the separate transmit coil 115 and receive coil 116 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

The static field generator 112 generates a strong static magnetic field Bo, which is used to line up nuclear spins in a target object (whose MRI image is being generated by the apparatus 100) along Bo. The gradient field generator 118, including the three orthogonal gradient coils, generates a gradient field G(r), which is superimposed on the static field Bo, so that nuclei in a selected plane can be excited by a proper choice of the frequency spectrum of the transverse RF excitation field. The RF excitation field generator 114 generates an RF excitation field B1+. When B1+ is applied to the object, typically as an RF excitation pulse transverse to Bo, the nuclei become excited (due to the RF energy imparted by the RF excitation pulse), so that the nuclear spins rotate by a flip angle. Subsequently, the excited nuclei gradually return to alignment with the static field Bo, giving up the excitation energy in the form of weak but detectable free induction decay (FID) signals, which are processed by the controller 130 to produce images of the target object.

The controller 130 controls the operation of the MRI apparatus 100, including but not limited to the generation of the gradient fields G(r), and B1+, as well as the processing of the FID signals resulting from the de-excitation (precession and relaxation) of the nuclei in the object. In particular, the controller 140, in conjunction with the three orthogonal gradient coils 118 and by the RF transmit coil 115, is configured to design and generate RF excitation pulses of various shapes that can be delivered in predetermined sequences. In some implementations, the RF excitation pulses are generated as a sequence referred to as the alternating repetition time (ATR) steady state free precession (SSFP) pulses. The ATR SSFP can be used to perform rapid magnetic resonance imaging as an alternative to slower and less sensitive gradient-echo techniques.

Figure 2:
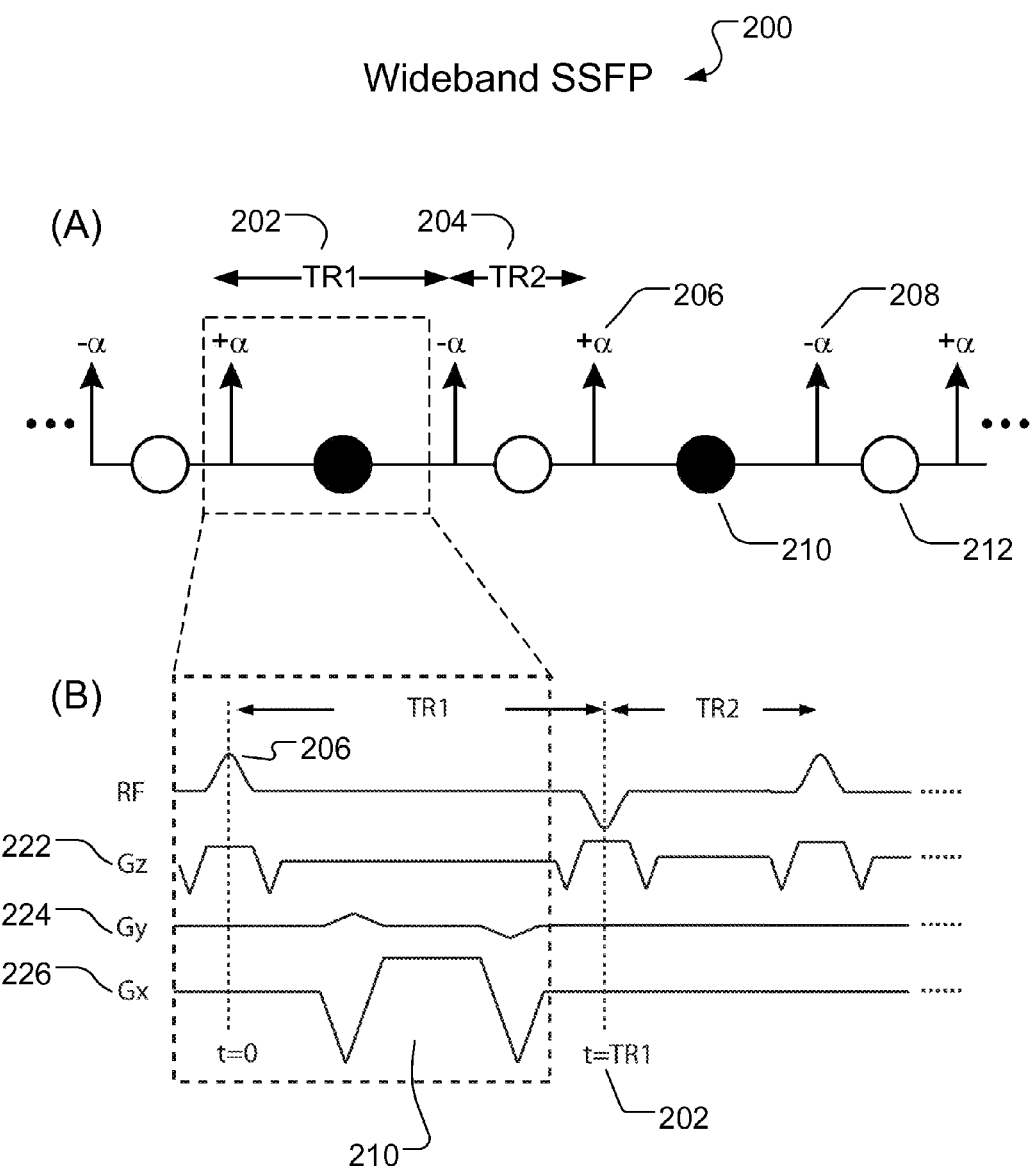
FIG. 2 illustrates an exemplary wideband SSFP sequence.

FIG. 2A illustrates an implementation of an ATR SSFP sequence called wideband SSFP 200. The wideband SSFP sequence 200 is characterized by two different repetition times TR1 202 and TR2 204. The phases of RF excitation (vertical arrows) in the two TRs are 0 and $\pi$, respectively. A full cycle of the steady state contains two excitations 206, 208 (with flip angle of magnitude $\alpha$) and two periods of free precession and relaxation. Unlike the case of balanced SSFP, the steady-state magnetization is alternating between two positions (angles) instead of returning to the same place after each excitation.

The two alternating repetition times TR1 202 and TR2 204 are used to produce an oscillating steady state with two distinct echoes, illustrated by the respectively black 210 and white 212 circles in FIG. 2A. Various gradient field Gx 226, Gy 224 and Gz 222 pulses can be used to spatially select the location of the specimen being measured. An exemplary time sequence of the gradient field Gx 226, Gy 224 and Gz 222 pulses within the first repetition TR1 202 is presented in FIG. 2B. For this example, the detected RF signal is recorded at half the first time repletion, TR1/2 202. A similar time sequence may be used during the second time repetition TR2 204. As a result of TR1 202 and TR2 204 being distinct, two distinctly different echoes are formed (indicated by the black and white circles) at respectively TR1/2 210 and TR2/2 212. A spin with resonance frequency $\Delta f$ precesses by different angles (phases) during the two intervals, and ends up in an asymmetric steady state.

The primary design parameter for the wideband SSFP sequence is the ratio of the short (TR2) 204 to long (TR1) 202 repetition times, defined as a=TR2/TR1 (0<a<=1). Both echoes detected during TR1 202 and TR2 204 may be used for imaging, however, as the ratio 'a' becomes small, it may be impractical to acquire data during TR2 (white circle) 212.

Figure 3:
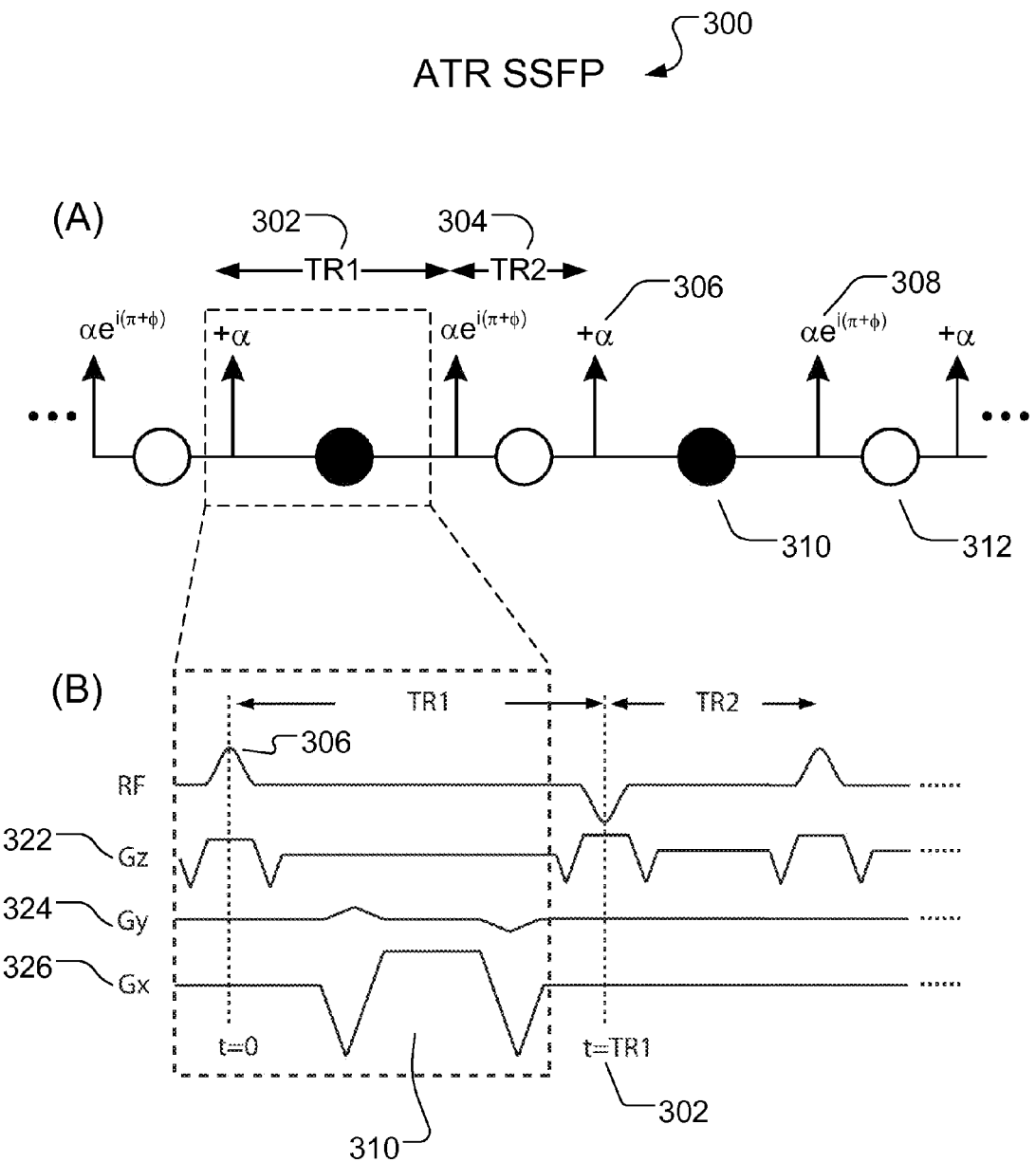
FIG. 3 illustrates an exemplary ATR SSFP sequence.

FIG. 3A presents another implementation of the ATR SSFP pulse sequence 300. In ATR SSFP the RF pulses (vertical arrows 306, 308) alternate between ($+\alpha$, $\alpha e^{i(\pi+\phi)}$). The phases of RF excitation in TR1 302 and TR2 304 are 0 and ($\pi+\phi$), respectively. The phase $\phi$ can be chosen between 0 and $\pi$. Once again, a full cycle of the steady state contains two excitations (with flip angle of magnitude $\alpha$) and two periods of free precession and relaxation. For the exemplary implementation illustrated in FIG. 3A, the ratio a=TR2/TR1 is chosen to be equal to 1/3 in order to modify the spectral response of the SSFP sequence to achieve fat suppression. FIG. 3B presents an exemplary time sequence of the gradient field Gx 326, Gy 324 and Gz 322 pulses within the first repetition TR1 302 corresponding to the fat-suppressed ATR SSFP sequence 300 of FIG. 3A. The RF pulses illustrated 306, 308 in FIG. 3B alternate between ($+\alpha$, $\alpha e^{i(\pi+\phi)}$).

Figure 4:
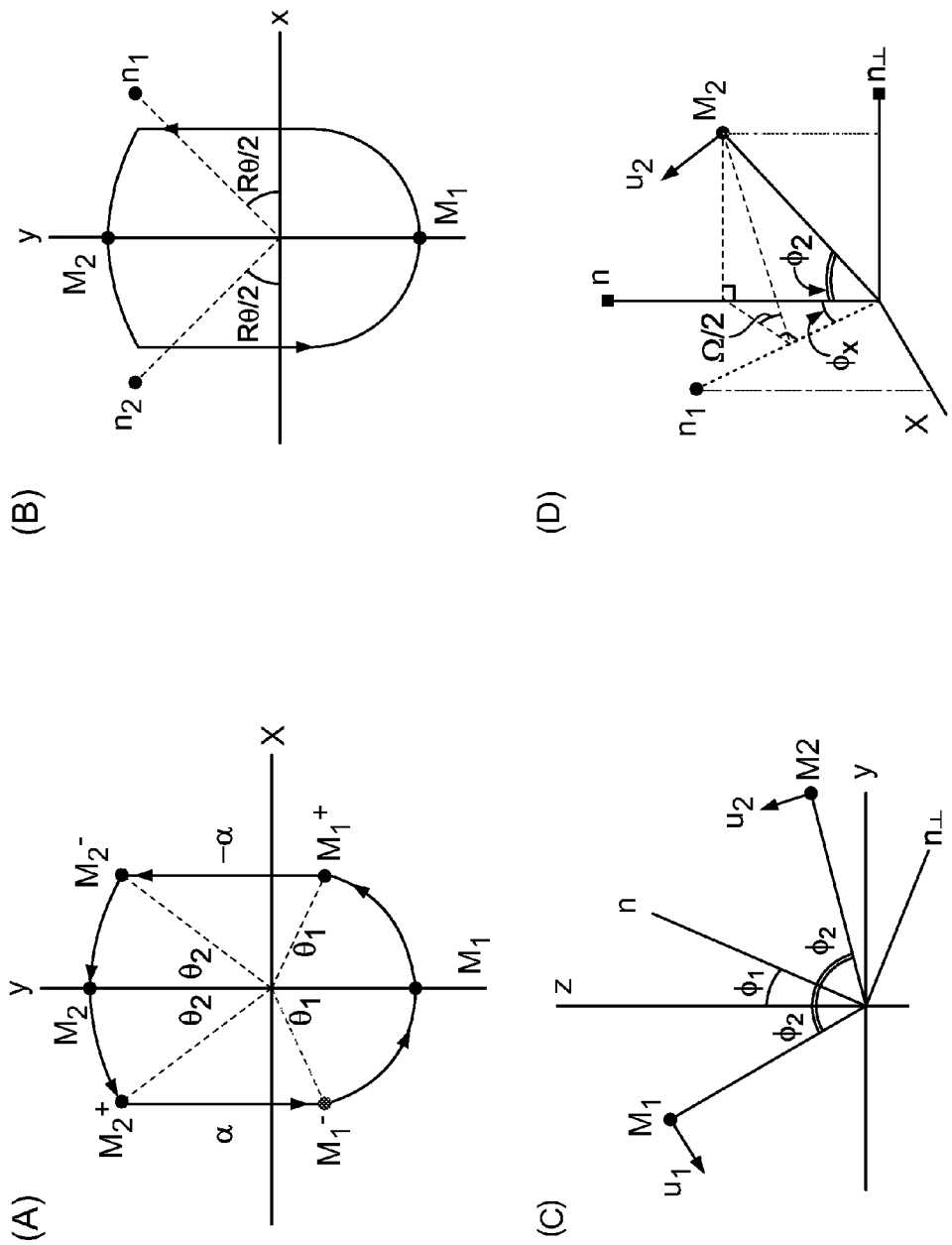
FIGS. 4A-D illustrate a relation between steady-state magnetizations.

A mathematical representation can be developed to describe the steady-state precession of the nuclear spins (or equivalently of a specimen magnetization) during the application of an ATR SSFP pulse sequence. The transition matrix for one full cycle of the alternating TR sequence is denoted R0. FIG. 4A illustrates that R0 rotates a magnetization from its position at TR1/2 (denoted M1) to TR2/2 (denoted M2) and back to M1 at the next TR1/2. Therefore, M1=R0M1 and the steady-state magnetization M1 define the axis of R0 rotation. R0 can be written as the product of a series of 3×3 orthogonal rotation matrices (all representing right-hand rotations):

$$R_0 = R_1 \cdot R_2 = [R_z(\theta_1) R_x(\alpha) R_z(\theta_2)] \cdot [R_z(\theta_2) R_x(-\alpha) R_z(\theta_1)] \quad \text{(EQ. 1)}$$

In EQ1, $\theta_1$ ($=-\Delta f \times \pi \times TR1$) and $\theta_2$ ($=-\Delta f \times \pi \times TR2$) are the Magnetization phase offsets due to off resonance effects during TR1/2 and TR2/2, respectively, and $\alpha$ is the flip angle. Rotation matrixes R1 and R2 correspond to the first and second half cycles, such that M2=R2M1 and M1=R1M2. For example, R1 can be mapped into its SU2 form Q1:

$$\begin{aligned} Q_1 &= Q_z(\theta_1) Q_x(\alpha) Q_z(\theta_2) \\ &= \begin{bmatrix} e^{-i\theta_1/2} & 0 \\ 0 & e^{i\theta_1/2} \end{bmatrix} \cdot \begin{bmatrix} \cos(\frac{\alpha}{2}) & -i\sin(\frac{\alpha}{2}) \\ -i\sin(\frac{\alpha}{2}) & \cos(\frac{\alpha}{2}) \end{bmatrix} \cdot \\ &\quad \begin{bmatrix} e^{-i\theta_2/2} & 0 \\ 0 & e^{i\theta_2/2} \end{bmatrix} \\ &= \cos(\frac{\alpha}{2})\cos(\frac{\theta}{2}) \cdot \\ &\quad I - i \begin{bmatrix} \cos(\frac{\alpha}{2})\sin(\frac{\theta}{2}) & \sin(\frac{\alpha}{2})e^{-iR\theta/2} \\ \sin(\frac{\alpha}{2})e^{iR\theta/2} & -\cos(\frac{\alpha}{2})\sin(\frac{\theta}{2}) \end{bmatrix} \end{aligned} \quad \text{(EQ. 2)}$$

In EQ. 2, $\theta=\theta_1+\theta_2$, $R=(\theta_1+\theta_2)/(\theta_1+\theta_2)$. Using the SU2 representation, a matrix Q can be expressed in terms of its rotation axis n ($=n_x i + n_y j + n_z k$) and rotation angle $\Omega$ as $$Q = \cos(\frac{\Omega}{2}) \cdot I - i \cdot \sin(\frac{\Omega}{2}) \cdot \begin{bmatrix} n_z & n_x - i n_y \\ n_x + i n_y & -n_z \end{bmatrix} \quad \text{(EQ. 3)}$$

Thus the rotation axis and the rotation angle corresponding to matrix Q1 can be identified as $$n_{1x} = \sin\left(\frac{\alpha}{2}\right)\cos\left(\frac{R\theta}{2}\right)$$ (EQ. 4)

$$n_{1y} = \sin\left(\frac{\alpha}{2}\right)\sin\left(\frac{R\theta}{2}\right)$$

$$n_{1z} = \cos\left(\frac{\alpha}{2}\right)\sin\left(\frac{\theta}{2}\right)$$

$$\Omega_1 = 2\cos^{-1}\left[\cos\left(\frac{\alpha}{2}\right)\cos\left(\frac{\theta}{2}\right)\right]$$

Similarly, the rotation axis and the rotation angle corresponding to matrix Q2 can be found as, $$n_{2x} = -\sin\left(\frac{\alpha}{2}\right)\cos\left(\frac{R\theta}{2}\right)$$ (EQ. 5)

$$n_{2y} = \sin\left(\frac{\alpha}{2}\right)\sin\left(\frac{R\theta}{2}\right)$$

$$n_{2z} = \cos\left(\frac{\alpha}{2}\right)\sin\left(\frac{\theta}{2}\right)$$

$$\Omega_2 = 2\cos^{-1}\left[\cos\left(\frac{\alpha}{2}\right)\cos\left(\frac{\theta}{2}\right)\right]$$

$$= \Omega_1$$

Note that the rotation angles $\Omega_1=\Omega_2=\Omega$. Also $W=2\cos-1$ $(\cos(q/2))=q$ for small a values. FIGS. 4B-D show the orientation of n1, n2, M1 and M2. Note that n1 and n2 are situated in the bisector plane of the angle formed by M1 and M2. Additionally, n1 and n2 are symmetric about the y-z-plane, and have norms $$\|n_1\| = \|n_2\|$$ (EQ. 6)

$$= [1 - \cos^2(\alpha/2)\cos^2(\theta/2)]^{1/2}$$

$$= [1 - \cos^2\Omega]^{1/2}$$

$$= \sin\Omega.$$

FIGS. 4B-C show the projections of the vectors on x-y and yz-planes, respectively, and FIG. 4D contains the three-dimensional depiction. The zenith angle between z-axis and n (the projection of n1 and n2 on y-z-plane) is denoted $\Phi 1$, and the angle between n and M1 (which is equal to the angle between n and M2) is denoted $\Phi 2$. The values of $\Phi 1$ and $\Phi 2$ are determined by the RF flip angles of the current R1 and R2 rotation. These two variables indicate the direction of the steady-state magnetizations, and are used for the calculation of transient oscillating residues.

FIGS. 4B-D are used next to describe the relation between angles $\Phi 1$, $\Phi 2$ and the RF flip angle $\alpha$. According to the plot in FIG. 4C, the angle between the z-axis and n is given by $$\tan\phi_1 = \frac{n_{1y}}{n_{1z}}$$ (EQ. 7)

$$= \frac{n_{2y}}{n_{2z}}$$

$$= \frac{\sin(\alpha/2)\sin(R\theta/2)}{\cos(\alpha/2)\sin(\theta/2)}$$

$$= \tan\left(\frac{\alpha}{2}\right) \cdot \frac{\sin(R\theta/2)}{\sin(\theta/2)}$$

For small values of $\alpha/2$, $\tan(\alpha/2)$ is approximately $\alpha/2$, therefore $\Phi 1=\alpha(\sin(R\theta/2))/(2\sin(\theta/2))$. Starting from thermal equilibrium (when magnetization is aligned with the z-axis), a sequence of excitations with RF flip angles $\{\alpha k\}$ may be applied. The change in $\Phi 1$ after k excitations can be expressed as $$\Delta\phi_1(k) = \phi_1(k) - \phi_1(k-1)$$ (EQ. 8)

$$= [\alpha_k - \alpha_{k-1}] \cdot \frac{\sin(R\theta/2)}{2\sin(\theta/2)}$$

$$= \Delta\alpha_k \cdot \frac{\sin(R\theta/2)}{2\sin(\theta/2)}.$$

Defining $\Phi 2$ as the angle between n and both M1 and M2 (see FIG. 4D) the following equation in $\Phi 2$ is obtained:

$$M_2 \cdot \cos\phi_2 \cdot \sin\phi_x \cdot \tan\left(\frac{\Omega}{2}\right) = M_2 \cdot \sin\phi_2$$ (EQ. 9)

Solving EQ. 9 for $\Phi 2$ leads to $$\tan\phi_2 = \sin\phi_x \cdot \tan\left(\frac{\Omega}{2}\right) = \frac{|n_{1x}|}{\|n_1\|} \cdot \frac{\sin(\Omega/2)}{\cos(\Omega/2)}$$ (EQ. 10)

$$= \frac{\sin(\alpha/2)}{\cos(\alpha/2)} \cdot \frac{\cos(R\theta/2)}{\cos(\theta/2)}$$

$$= \tan\left(\frac{\alpha}{2}\right) \cdot \frac{\cos(R\theta/2)}{\cos(\theta/2)}$$

When $\alpha$ small, EQ. 10 leads to $\Phi 2=\alpha(\cos(R\theta/2))/(2\cos(\theta/2))$. Hence, the change in the value of $\Phi 2$ after k excitations can be represented using:

$$\Delta\phi_2(k) = \phi_2(k) - \phi_2(k-1) = [\alpha_k - \alpha_{k-1}] \cdot \frac{\cos(R\theta/2)}{2\cos(\theta/2)}$$ (EQ. 11)

$$= \Delta\alpha_k \cdot \frac{\cos(R\theta/2)}{2\cos(\theta/2)}$$

Equations 8 and 11 indicate that for spins of a certain resonant frequency, the absolute value of increments in $\Delta\Phi 1$ and $\Delta\Phi 2$ are proportional to the absolute value of RF flip angle increment $\Delta\alpha$.

Returning to FIGS. 2A and 3A, the ATR SSFP sequences represent steady-state oscillations of the magnetization between M1 and M2 (as illustrated in FIG. 4C). However, the sequences depicted in FIGS. 2A and 3A represent snapshots of ATR SSFP sequences taken after the respective steady-states have been reached. (See ellipsis at the left and right edges of the time series in FIGS. 2A and 3A.) At early times (not shown in FIGS. 2A and 3A), as the magnetization of the specimen is excited from a thermal equilibrium state (parallel to the main field Bo along the z-axis) to the steady-state characterized by magnetizations M1 and M2, transient oscillations may be induced. Such transient oscillations cause fluctuations in the detected signal which in turn can result in image artifacts. The duration of these transient oscillations is on the order of the T1 relaxation time. A mathematical representation of the transient oscillations is presented below.

Referring again to FIG. 4C, an oscillatory residue $\epsilon$ can be expressed as the magnetization component perpendicular to its steady state orientation. The oscillatory residue $\epsilon$ lies in the (u1, x) plane (perpendicular to M1) at TR1/2 and in the (u2, x) plane (perpendicular to M2) at TR2/2.

After k RF excitations, the oscillatory residue $\epsilon_k$ can be calculated by first adding the shift in the steady-state magnetization vector (=the origin of (u,x) plane) to $\epsilon_{k-1}$, then apply the $\Omega$ rotation. The relation between the oscillatory residues in two consecutive echoes can thus be written as $$\epsilon_k = e^{-i\Omega}[\epsilon_{k-1} + \Delta\phi_1(k)|M| + e^{-\pi k}\Delta\phi_2(k)|M|] \quad (EQ.\ 12)$$

The Exp(-i$\pi$k) term in Eq. 12 represents the alternating sign of $\Delta\Phi 2$ During TR1 and TR2. Defining the phase-shifted oscillatory residue $\epsilon_k = \epsilon_k \exp(i\Omega k)$ and setting the magnetization magnitude M=1, EQ. 12 can be modified to $$\begin{aligned}\epsilon_k &= e^{i\Omega k}\varepsilon_k \quad (EQ.\ 13)\\ &= e^{i\Omega(k-1)}\varepsilon_{k-1} + e^{i\Omega(k-1)}[\Delta\phi_1(k) + e^{-i\pi k}\Delta\phi_2(k)]\\ &= \varepsilon_{k-1} + e^{i\Omega(k-1)}\frac{\sin(R\theta/2)}{2\sin(\theta/2)}\cdot\Delta\alpha_k - e^{i(\Omega-\pi)(k-1)}\frac{\cos(R\theta/2)}{2\cos(\theta/2)}\cdot\Delta\alpha_k\end{aligned}$$

Using the fact that when the preparatory sequence first starts from thermal equilibrium, $\epsilon 0=0$ and $\Omega=\theta$, the oscillatory residue $\epsilon_p$ after p excitations (p is an even number) is found to be:

$$\epsilon_p = \frac{1}{2}\left[\frac{\sin(R\theta/2)}{\sin(\theta/2)}\sum_{k=1}^{p}(e^{i\theta(k-1)}\Delta\alpha_k) - \frac{\cos(R\theta/2)}{\cos(\theta/2)}\sum_{k=1}^{p}(e^{i(\theta-\pi)(k-1)}\Delta\alpha_k)\right] \quad (EQ.\ 14)$$

Thus, the oscillatory residue $\epsilon_p$ perpendicular to the steady-state magnetization can be expressed as the Fourier transforms of flip angle increment sequence $\{\Delta\alpha k\ (=\alpha k-\alpha k-1, \alpha 0=0, \alpha p=\alpha)\}$. The first term is the Fourier transform of $\Delta\alpha k$ multiplied by a function of $\theta$; the second term is the same Fourier transform shifted by $\pi$ and multiplied by another function of $\theta$.

Reducing the transient oscillations quantified in EQ. 14 may lead to an accelerated approach to steady-state from a thermal equilibrium state, which is advantageous when using the wideband SSFP in contrast sensitive rapid acquisition applications. A preparation (or conditioning) sequence of pulses to reduce or eliminate the undesirable transient oscillations can be designed using the techniques and systems as further described below. Such a conditioning sequence of pulses when applied to the specimen magnetization under thermal equilibrium can place the magnetization substantially in one of the two states, for example M1 in FIGS. 4A-D, of the (predetermined) excited steady-state magnetization.

A windowing function $\{w_k\}$ is then chosen as the base flip angle increment sequence for initial preparation. The $\{w_k\}$ is split into two separate series of its odd and even elements. The two separate series are multiplied with scale parameters b1 and b2, respectively (b1+b2=1 in order to meet the constraint $\alpha p=\alpha$). The new flip angle increment sequence becomes $\{b_m w_k\}$ (m=1 when k is even, m=2 when k is odd), and the oscillatory residue can be re-written as $$\epsilon_p = \frac{\sin(R\theta/2)}{\sin(\theta/2)}\left[b_1\sum_{k=1}^{p/2}(e^{i\theta(2k-1)}w_{2k}) + b_2\sum_{k=1}^{p/2}(e^{i\theta(2k-2)}w_{2k-1})\right] + \frac{\cos(R\theta/2)}{\cos(\theta/2)}\left[b_1\sum_{k=1}^{p/2}(e^{i\theta(2k-1)}w_{2k}) - b_2\sum_{k=1}^{p/2}(e^{i\theta(2k-2)}w_{2k-1})\right] \quad (EQ.\ 15)$$

The scale parameters b1 and b2 can be optimized for any resonance offset by minimizing the absolute value of $\epsilon_p$ at $\theta=\theta_0=-\Delta f\pi(TR1+TR2)$. From EQ. 15, $\epsilon_p(\theta=\theta_0)$ has its minimum when $$|\epsilon_p|_{\theta\sim\theta_0} = \left[\frac{\sin(R\theta/2)}{\sin(\theta/2)}(b_1+b_2) + \frac{\cos(R\theta/2)}{\cos(\theta/2)}(b_1-b_2)\right]. \quad (EQ.\ 16)$$

$$\mathcal{F}\{w_{2k-1}\} = 0$$

In EQ. 16, the Fourier transform factor is not zero everywhere, therefore the quantity in the square brackets is set to zero leading to $$\left(1 + \frac{\tan\left(\frac{R\theta_0}{2}\right)}{\tan\left(\frac{\theta_0}{2}\right)}\right)b_1 = \left(1 - \frac{\tan\left(\frac{R\theta_0}{2}\right)}{\tan\left(\frac{\theta_0}{2}\right)}\right)b_2 \quad (EQ.\ 17)$$

Figure 5:
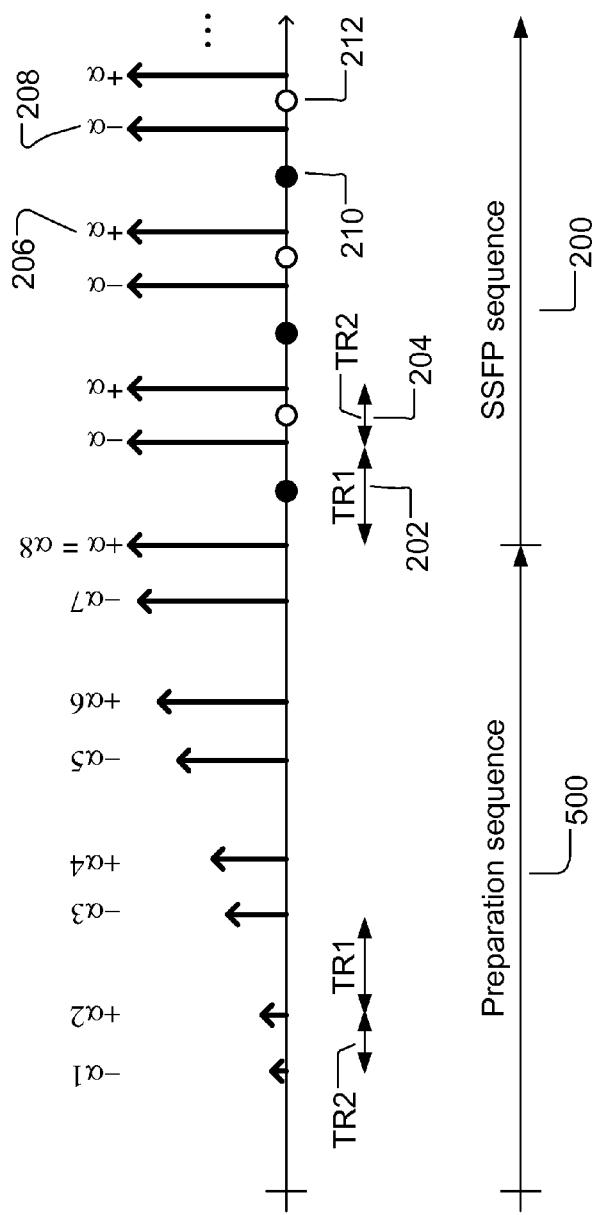
FIG. 5 shows a wideband SSFP sequence preceded by a preparation sequence.

To design preparation sequences for desired applications, the scale parameters b1 and b2 can be obtained by solving EQ. 17 and the constraint b1+b2=1 (introduced earlier regarding EQ. 15). For example, considering a wideband SSFP sequence (alternating TR SSFP with $(0, \pi)$ phase-cycling) as shown in FIG. 2A, for the center of passband $\theta=0$, the optimized b1 and b2 are found to satisfy the following expression: b1/b2=(1-R)/(1+R)=TR2/TR1. FIG. 5 shows an optimized eight-step Kaiser-Bessel windowed flip angle increment sequence $\{\Delta\alpha k\}$, having elements that form an alternatively scaled Kaiser-Bessel windowing function. For the exemplary wideband SSFP sequence in FIG. 5, the ratio a=TR2/TR1=1/2, and the optimized b1 and b2 for on-resonance spins are found to satisfy b1/b2=a=1/2. The term alternatively scaled means that odd elements of the angle increment set $\{\alpha k\}$ are multiplied (scaled) by parameter b1 508, and the (alternate) even elements of the angle increment set $\{\alpha k\}$ are multiplied (scaled) by parameter b2 506.

The example preparation sequence 500 in FIG. 5 includes eight pulses (four pulses of odd phase, and four pulses for even phase), each pulse providing an incremental change in the orientation of the specimen magnetization. The actual increments of the flip angle ramp for the preparation sequence 500 are shown in the lower left diagram of FIG. 5. As indicated by the constraint $\alpha_8=\alpha$, the cumulative effect of the preparation sequence 500 in FIG. 5 is to place the magnetization in state M1 or M2 of the desired steady-state. The preparation sequence 500 is followed by a select wideband SSFP sequence 200 (in this example a=0.5) that alternatively flips the magnetization by an angle $\alpha$ between the steady-states M1 and M2 (see FIGS. 4A-D.)

The methods described above can be generalized to ATR SSFP sequences with an RF phase-cycling of $(0, \pi+\phi)$, where $0<=\phi<\pi$. The phase offset $\phi$ was introduced earlier with respect to FIG. 3A. The oscillatory residue can be obtained by substituting $R\theta$ in EQ. 15 with $(R\theta-\phi)$:

$$\epsilon_p = \qquad \text{(EQ. 18)}$$

$$\frac{\sin((R\theta-\varphi)/2)}{\sin(\theta/2)}\left[b_1\sum_{k=1}^{p/2}(e^{i\theta(2k-1)}w_{2k})+b_2\sum_{k=1}^{p/2}(e^{i\theta(2k-2)}w_{2k-1})\right]+$$

$$\frac{\cos((R\theta-\varphi)/2)}{\cos(\theta/2)}\left[b_1\sum_{k=1}^{p/2}(e^{i\theta(2k-1)}w_{2k})-b_2\sum_{k=1}^{p/2}(e^{i\theta(2k-2)}w_{2k-1})\right]$$

EQ. 17 between the optimized scalars b1 and b2 becomes $$\left(1+\frac{\tan[(R\theta_0-\varphi)/2]}{\tan(\theta_0/2)}\right)\cdot b_1 = \left(1-\frac{\tan[(R\theta_0-\varphi)/2]}{\tan(\theta_0/2)}\right)\cdot b_2 \qquad \text{(EQ. 19)}$$

Figure 6:
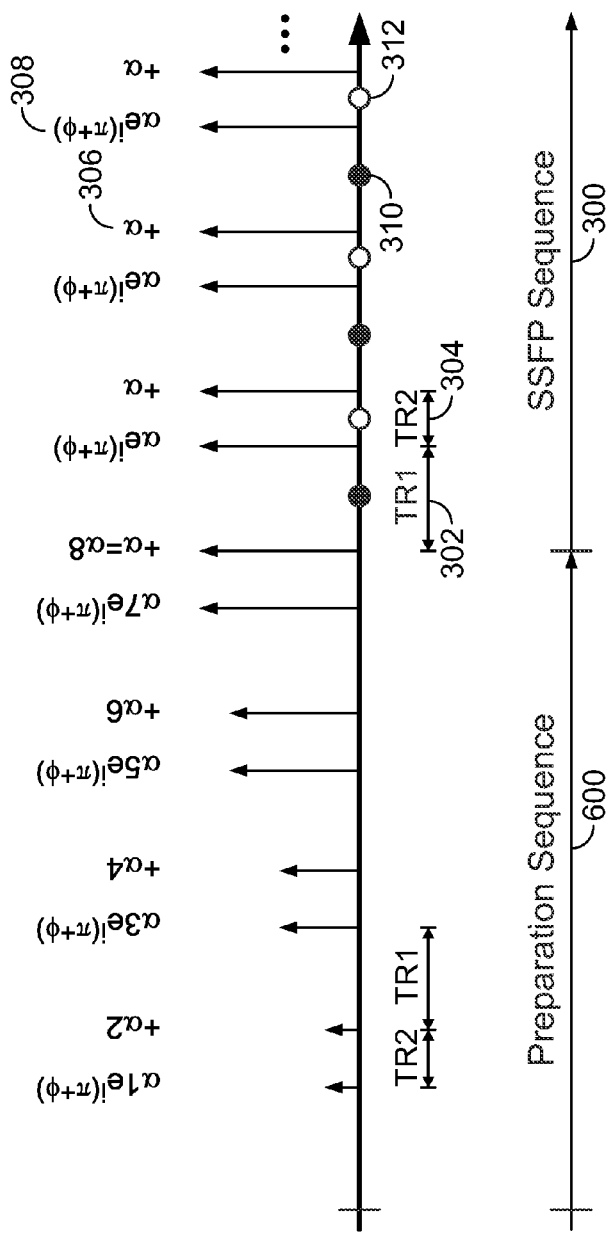
FIG. 6 shows an FS-ATR SSFP sequence (optimized for fat) preceded by a preparation sequence.
Figure 6:
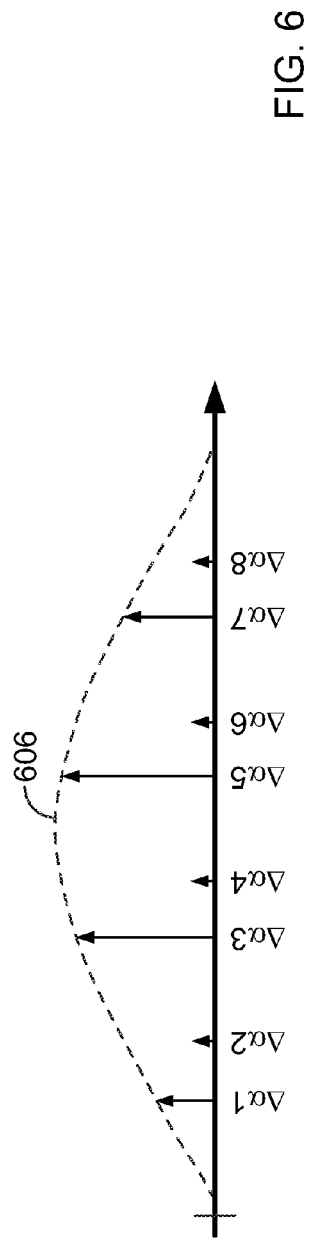

To design preparation sequences for desired applications using ATR-SSFP, the scale parameters b1 and b2 can be obtained by solving EQ. 19 and the constraint b1+b2=1. For example, an FS-ATR SSFP sequence 300 as illustrated in FIG. 3A, with TR2=TR1/3 and (0; 3/4π) RF phase-cycling has center of the stopband (for fat frequency) at $\theta_0=\pi/2$. Using EQ. 19, the optimized b1 and b2 for fat frequency can be found as b1=0 and b2=1. FIG. 6 shows flip angle increments and amplitudes in the FS-ATR SSFP preparation scheme designed using Kaiser-Bessel window and the optimized (b1, b2) values for the fat band.

The example preparation sequence 600 in FIG. 6 includes eight pulses. In this example, the four pulses of odd phase in EQ. 18 are respectively equal in magnitude to the four pulses of even phase in EQ. 18. Each of the eight pulses provides an incremental change in the orientation of the specimen magnetization. The actual increments of the flip angle ramp 606 for the preparation sequence 600 are shown in the lower left diagram of FIG. 6. Again, as indicated by the constraint $\alpha_8=\alpha$, the cumulative effect of the preparation sequence 600 in FIG. 6 is to place the magnetization in state M1 or M2 of the desired steady-state. The preparation sequence 600 is followed by the FS-ATR SSFP sequence 300 (with TR2/TR1=1/3, optimized for fat frequency) that flips the magnetization by an angle α between the steady-states M1 and M2 in an alternating fashion (see FIGS. 4A-D).

In some implementations, preparation sequences can be designed for an FS-ATR SSFP sequence 300 (as illustrated in FIG. 3A with TR2=TR1/3 and (0, 3/4π) RF phase-cycling) optimized for water frequency to image water. The center of passband (for water frequency) is at $\theta_0=-\pi/2$ (omitting the RF phase increment to shift water to θ=0, for simplicity). Solving Eq. (19), the optimized b1 and b2 for water frequency can be found as b1=b2=0.5. Flip angle increments and amplitudes 706 in the FS-ATR SSFP preparation scheme designed using Kaiser-Bessel window and the optimized (b1, b2) values for the water band are shown in FIG. 7.

Figure 7:
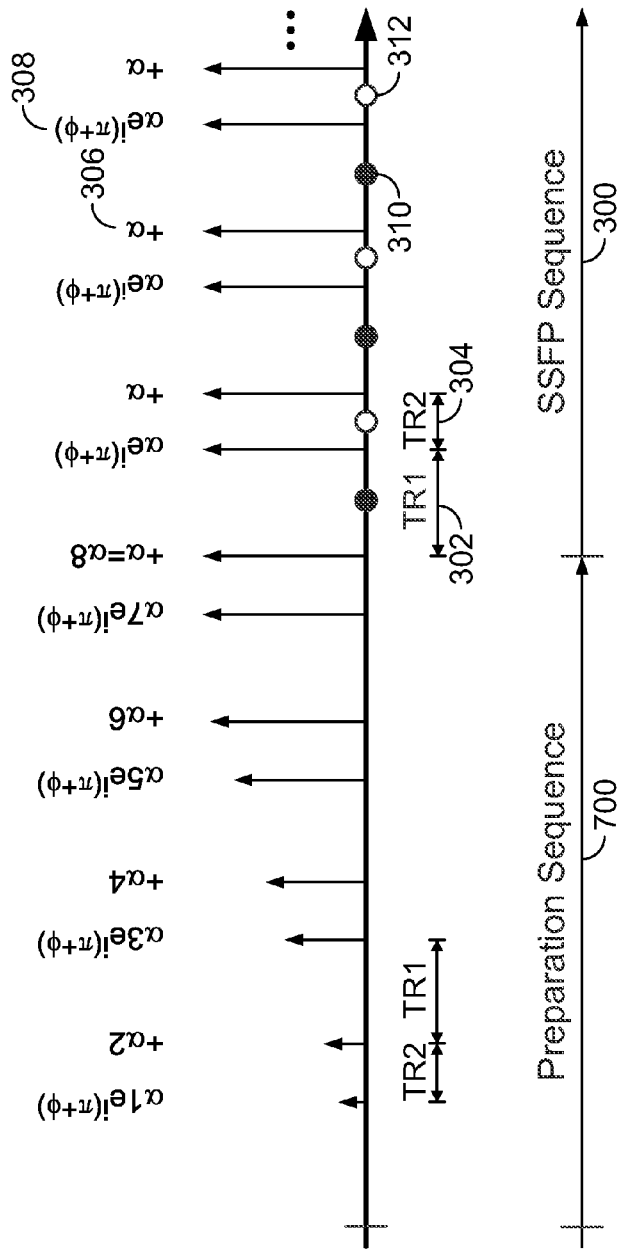
FIG. 7 shows an FS-ATR SSFP sequence (optimized for water) preceded by a preparation sequence.
Figure 7:
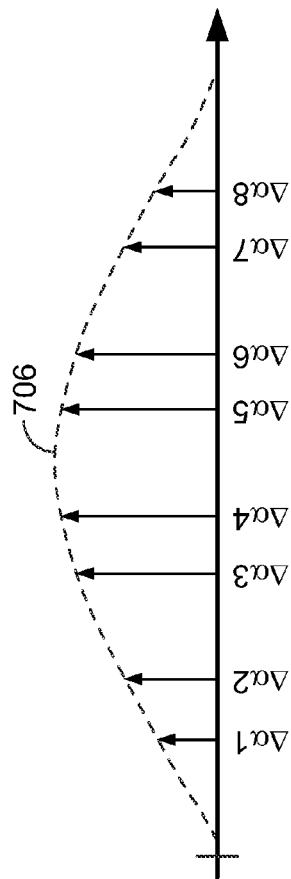

The example preparation sequence 700 in FIG. 7 includes eight pulses (four pulses of odd phase, and four pulses for even phase), each pulse providing an incremental change in the orientation of the specimen magnetization. The actual increments of the flip angle ramp 706 for the preparation sequence 700 are shown in the lower left diagram of FIG. 7. As indicated by the constraint $\alpha_8=\alpha$, the cumulative effect of the preparation sequence in FIG. 7 is to place the magnetization in state M1 or M2 of the desired steady-state. The preparation sequence 700 is followed by the FS-ATR SSFP sequence 300 (with TR2/TR1=1/3, optimized for water frequency) that flips the magnetization by an angle α between the steady-states M1 and M2 in an alternating fashion (see FIGS. 4A-D).

Figure 8:
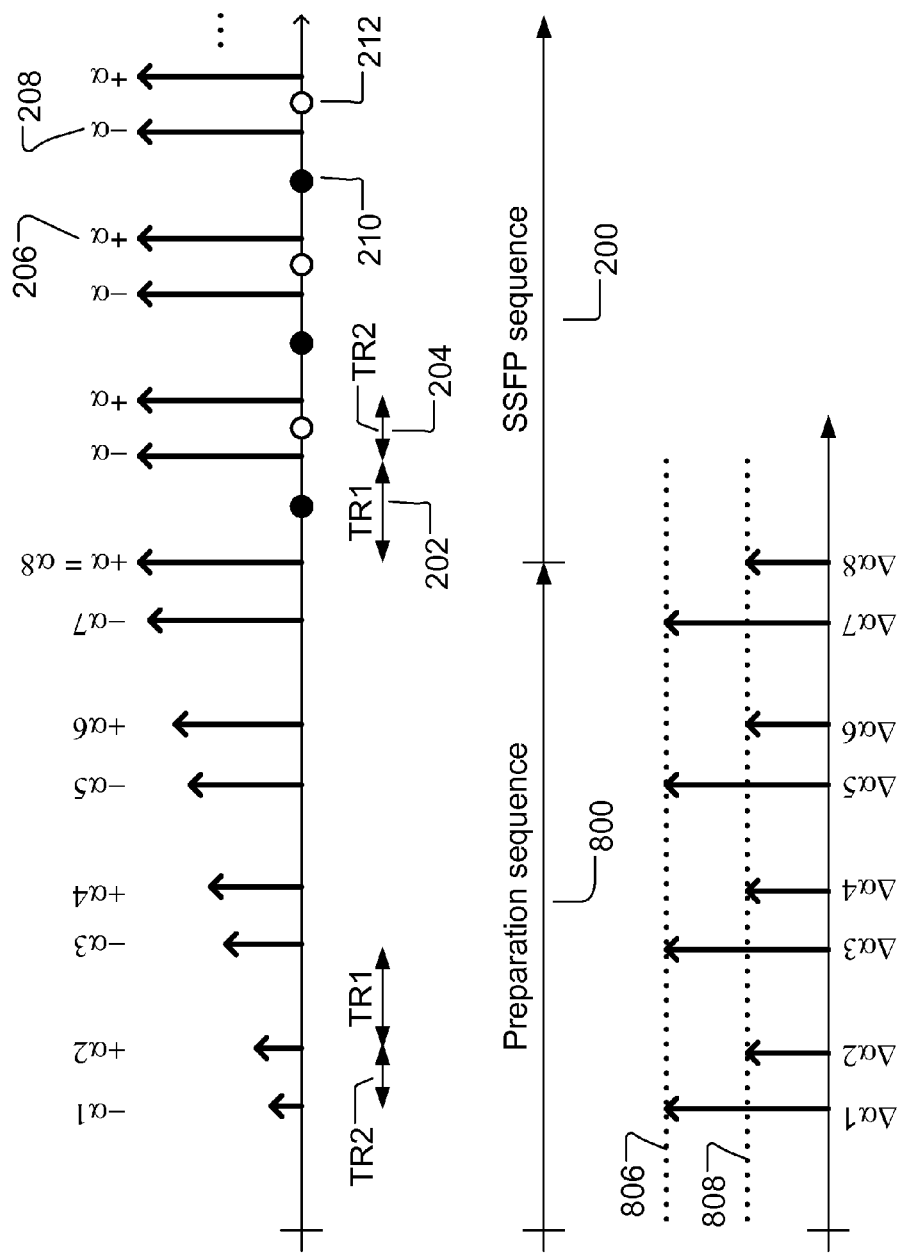
FIG. 8 shows a wideband SSFP sequence preceded by another preparation sequence.

FIG. 8 shows a reference conditioning sequence 800 for comparing the conditioning sequences as described in this specification. Specifically, FIG. 8 illustrates a time sequence including a reference preparation sequence based on linear-ramp windows 808, 806 followed by a wideband SSFP sequence 200. In this reference implementation, the linear-ramp preparation sequence as described in FIG. 5 includes eight pulses (four pulses of odd phase, and four pulses for even phase), each pulse providing an incremental change in the orientation of the specimen magnetization. The actual increments of the flip angle ramp 808, 806 for the preparation sequence 800 are shown in the lower left diagram of FIG. 8. Note that the linear ramp is based on rectangular windows, 808, 806 i.e. the flip angle increments are constant.

The magnitudes of the incremental angles can be selected such that the cumulative effect of the preparation sequence 800 in FIG. 8 is to place the magnetization in state M1 or M2 of the desired steady-state. The reference preparation sequence 800 is followed by the wideband SSFP sequence 200 (with a=0.5) that alternatively flips the magnetization by an angle α between the steady-states M1 and M2 (see FIG. 4.) Measurements and simulation results including preparation sequences described in FIGS. 5-8 are presented below with respect to FIGS. 10-13.

Figure 9:
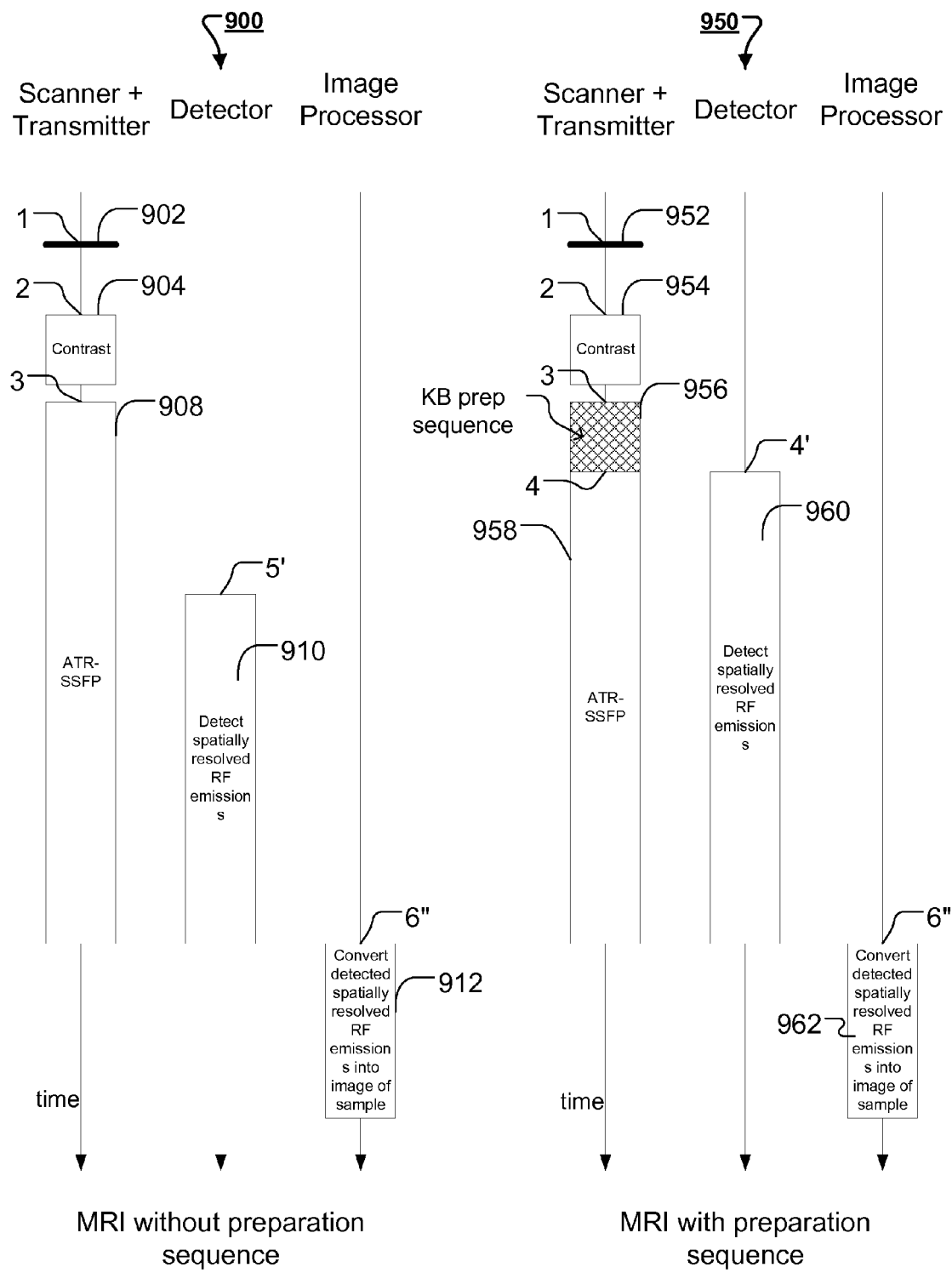
FIG. 9 illustrates a method for magnetic resonance imaging.
Figure 10:
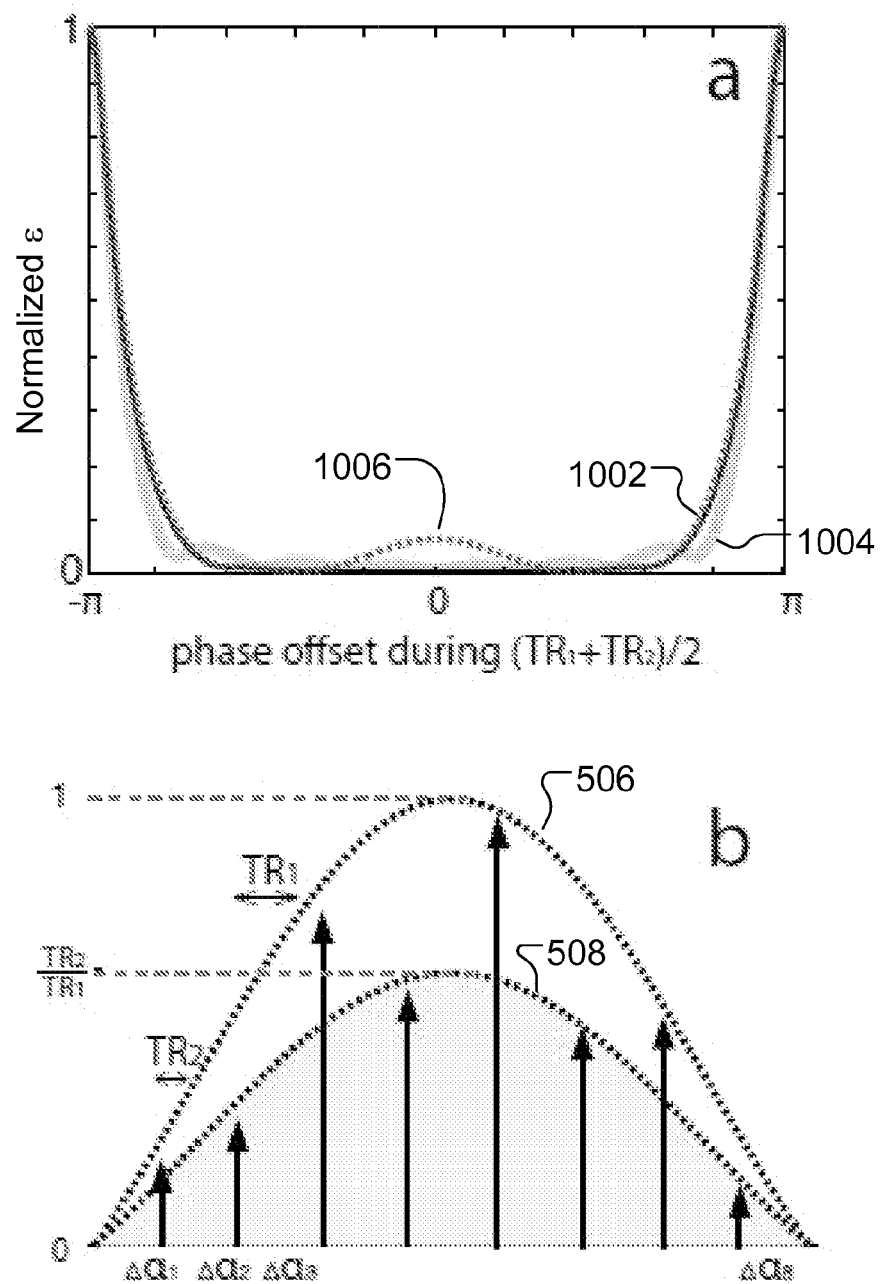
FIGS. 10-13 show simulation and measurements performed using preparation sequences described in the specification.
Figure 11:
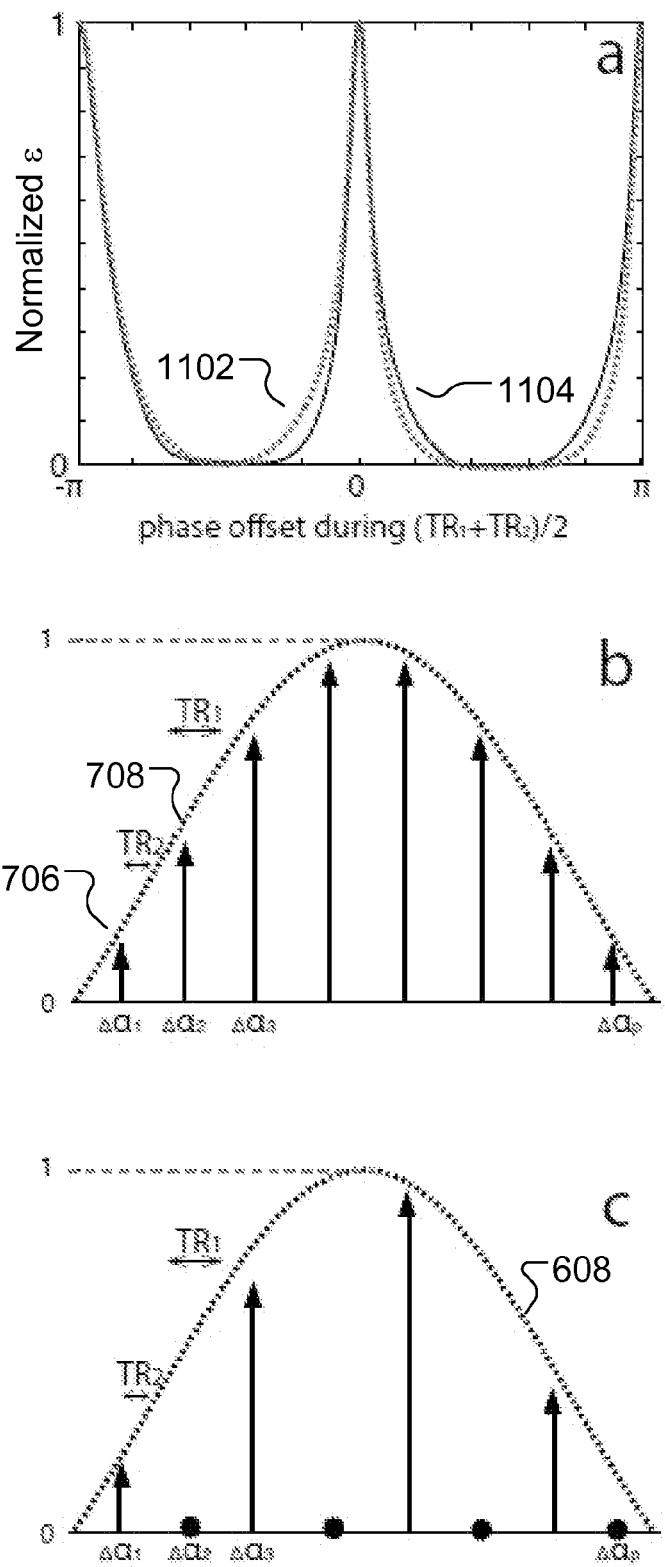
Figure 12:
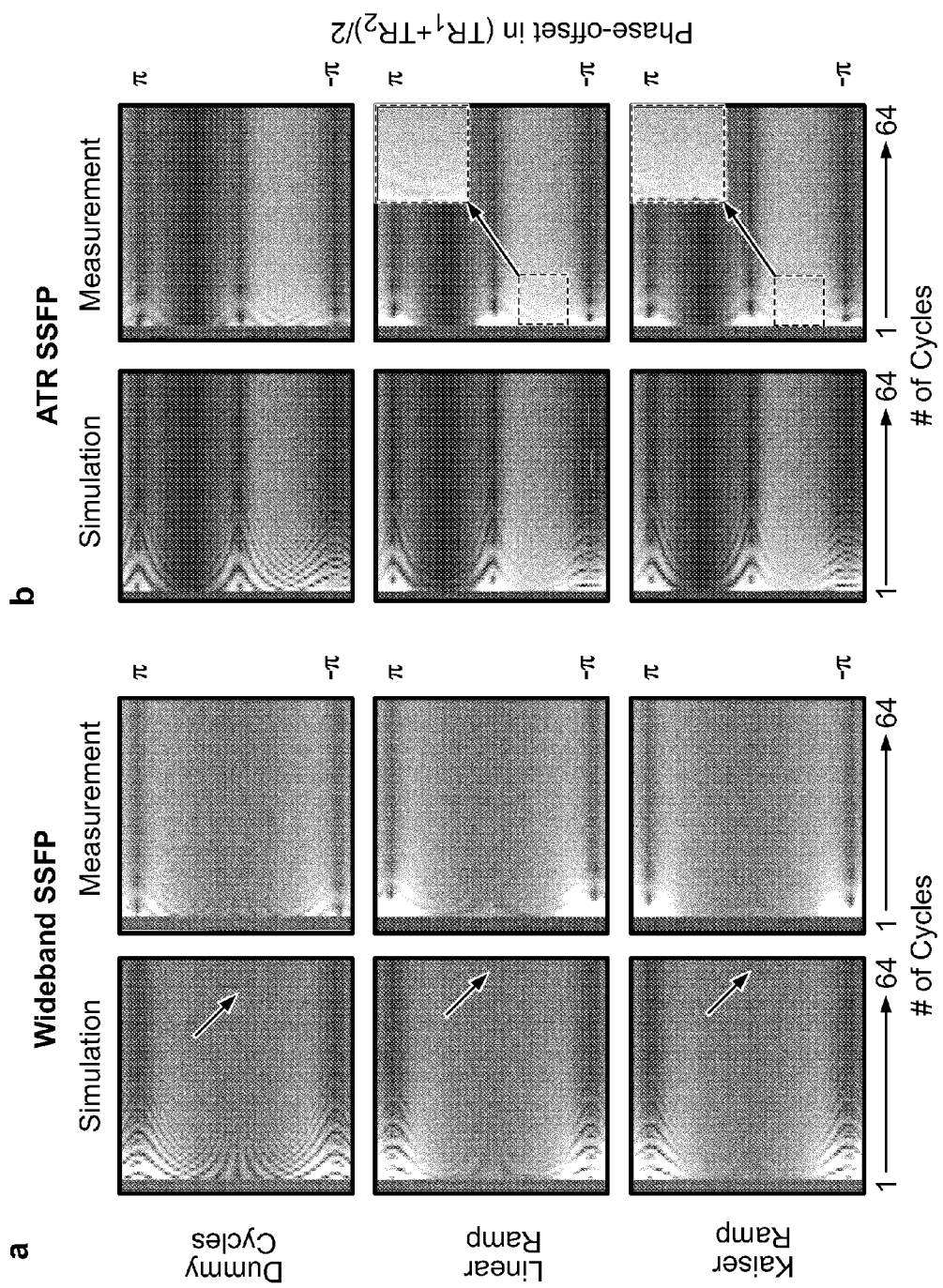

FIG. 9 shows two methods for obtaining images of a sample using magnetic resonance imaging. Method 900 is based on an ATR-SSFP pulse sequence that is not preceded by a preparation sequence. Method 950 is based on an ATR-SSFP pulse sequence that is preceded by a preparation sequence as described in this specification. Methods 900 and 950 are illustrated using a swim-lane diagram. The time flows in vertical direction, from the top of FIG. 9 to the bottom. For example, time 1 is earlier than time 2, and so on. The time intervals depicted in FIG. 9 are not proportional. In fact, the time instances 1, 2, etc., depict a relative relationship.

Steps performed using a certain component of MRI system 100 are depicted on a respective time line labeled for the respective component. For example, steps of method 900 or 950 performed using the scanner 110 (including the magnet 112 and the three orthogonal gradient coils 118) and the RF Transmit Coil 115 are depicted on the respective time lines labeled (Scanner+Transmitter). Other steps of method 900 or 950 performed using the RF Receive Coil 115 are depicted on the respective time lines labeled (Detector). Finally, the imaging step performed using the controller 130 are depicted on the respective time lines labeled (Image Processor).

At step 902, a sample is magnetized in a uniform magnetic field provided by magnet 112 to orient a portion of nuclear spins thus obtaining an equilibrium magnetization within the specimen. The uniform magnetic field is turned on at time 1 and it is being applied to the sample until the end of the signal acquisition step 910, at time 6.

At step 904, a contrast preparation scheme, also known as a magnetization preparation step, is applied to the equilibrium magnetization prior to the ATR-SSFP step 908, to prepare the sample for an application specific imaging, wherein the application includes fat saturation or inversion recovery. The contrast preparation step 904 starts at time 2.

At step 908, the contrast-conditioned magnetization is excited into a steady-state excitation using an ATR SSFP pulse sequence. The excitation is applied starting at time 3. Time 3 follows shortly after the end of the end of the contrast preparation step 904. In some implementations, the beginning of step 908 can coincide with the end of step 904. The ATR SSFP pulse sequence used during step 908 may be chosen from the pulse sequences illustrated in FIG. 2A or 3A. The ATR SSFP pulse sequence flips the contrast-conditioned magnetization between a first excited state and a second excited state separated by a predetermined flip angle and a predetermined relative phase. The ATR SSFP pulse sequence is repetitive and has different alternating repetition times.

At step 910, spatially-resolved RF emissions from the steady-state excitation of the magnetization are being detected. The acquisition of the spatially-resolved signals that lead to an image with no artifacts due to transient magnetization starts at time 5. Spatially-resolved RF emissions that are detected before time 5 contain an oscillatory component from the transient magnetization. The oscillations are caused by a sudden change in magnetization between the contrast-conditioning step 904 to the excitation step 908. These transient oscillations can last for times of the order of magnitude of T1, the spin-lattice relaxation, which is of order seconds. For the reason above, many of the early ATR-SSFP pulses cause image artifacts, therefore cannot be used for imaging.

At step 912, the spatially-resolved detected RF emissions are being converted into an image of the sample. The imaging step starts at time 6 and can be performed by an image processor, for example, at the controller. Image quality is benefited if signal can be acquired from a large number of ATR SSFP cycles that have no transient oscillations. Therefore, it is desired to eliminate the transient oscillations from the early cycles of the ATR SSFP sequence to enable starting the acquisition step 910 as early as possible after time 3. Such excitation—detection configuration is summarized below regarding method 950.

At step 952, a sample is magnetized in a uniform magnetic field to orient a portion of nuclear spins thus obtaining an equilibrium magnetization within the specimen. The uniform magnetic field is turned on at time 1 and it is being applied to the sample until the end of the signal acquisition step 960, at time 6.

At step 954, a contrast preparation scheme, also known as a magnetization preparation step, is applied to the equilibrium magnetization prior to the preparation step 956, to condition the sample for an application specific imaging. The application includes fat saturation or inversion recovery. The contrast preparation step 904 starts at time 2.

At step 956, a preparation sequence of RF pulses is applied to the contrast-conditioned magnetization. The preparation sequence is applied starting at time 3. Time 3 follows shortly after the end of the end of the contrast preparation step 954. In some implementations, the beginning of preparation step 956 can coincide with the end of step contrast-conditioning step 954. Depending on the subsequent ATR-SSFP pulse sequence, the preparation pulse sequence used during step 956 may be chosen from the preparation sequences illustrated in FIGS. 5-7, as described in this specification.

The preparation sequence of RF pulses is repetitive and has different alternating repetition times that match the subsequent ATR SSFP pulse sequence. The preparatory sequence of RF pulses is designed to minimize the transient magnetization oscillations of the during the subsequent ATR SSFP pulse sequence. The longer the time duration of the preparatory step, the fewer cycles of the subsequent ATR SSFP sequence are being affected by transient oscillations. The preparation sequence of RF pulses contains an even number of pulses, for example 8 pulses.

At step 958, the prepared magnetization is excited into a steady-state excitation using an ATR SSFP pulse sequence. The excitation is applied starting at time 4. Time 4 coincides with the end of the preparation step 956. In fact, the previously applied preparation sequence is designed to have its last pulse coincide to the first pulse of the ATR SSFP sequence. The ATR SSFP pulse sequence used during step 958 can be chosen from the sequences illustrated in FIG. 2A or 3A. The ATR SSFP pulse sequence flips the conditioned magnetization between a first excited state and a second excited state separated by a predetermined flip angle and a predetermined relative phase. The ATR SSFP pulse sequence is repetitive and has different alternating repetition times.

At step 960, spatially-resolved RF emissions from the steady-state excitation of the magnetization are being detected. In contrast to method 900, the acquisition of the spatially-resolved signals that lead to an image with no artifacts due to transient magnetization starts at time 4, for method 950. The previously prepared magnetization exhibits fewer and smaller amplitude transient oscillations at the beginning of step 958 of method 550, than the unprepared magnetization at the beginning of the corresponding step 908 of method 900. Unlike the time interval of order seconds from time 3 to time 5 in method 500, the time interval from time 3 to time 4 is of the order tens of milliseconds—the duration of the preparation sequence of RF pulses. For the reason above, most (if not all) of the early ATR-SSFP pulses are free from transient oscillations and are being used for imaging.

At step 962, the spatially-resolved detected RF emissions are being converted into an image of the sample. The imaging step starts at time 6 and can be performed by an image processor, for example, on the controller. Image quality is benefited because for method 950 the signal can be acquired from a large number of ATR SSFP cycles that have no transient oscillations.

Method 950 can be implemented, for example, in MRI system 100 to validate the reduction in transient oscillations for several of the ATR SSFP sequencing in FIGS. 5-8.

FIG. 10A shows simulated results for wideband SSFP with $(0,\pi)$ RF phase-cycling. For example, FIG. 10A illustrates the absolute values of oscillatory residues after different eight-step preparations are applied as functions of resonant frequency. The black solid line 1002 represents Kaiser-Bessel windowed ramp with scale parameters optimized using EQ. 6 (beta=3), the grey dashed line 1006 represents a Kaiser-Bessel window (beta=3) with b1=b2=0.5, and the grey solid line 1004 represents a linear ramp, as shown in FIG. 8. The Kaiser-Bessel windowed ramp shows superior oscillatory residue suppression than the non-optimized Kaiser-Bessel ramp and the linear ramp (see FIG. 8 for an illustration of the linear ramp).

FIG. 10B illustrates the RF flip angle increment sequence of the optimized Kaiser-Bessel ramp preparation 508, 506. This KB preparation sequence is also depicted in the lower left side of FIG. 5.

FIG. 11A shows simulated results for FS-ATR SSFP with $(0,\pi+\phi)$ RF phase-cycling. For example, FIG. 11A illustrates the absolute values of oscillatory residues after eight-step Kaiser-Bessel windowed ramp preparations. The black solid line 1104 represents Kaiser-Bessel windowed ramp (beta=3) optimized for water band, and grey dotted line 1102 represents the Kaiser-Bessel ramp (beta=3) optimized for fat band. A smaller transition bandwidth is observed in the band which the initial ramp is optimized for fat. Any even number of preparation pulses can be used in the conditioning sequence designed based on the techniques described in this specification. Larger numbers of preparation pulses can further reduce the transient oscillation but take more time.

FIGS. 11B-C illustrate the RF flip angle increment sequences of the Kaiser-Bessel ramp preparation optimized for water 708, 706 (see FIG. 7) and fat 608 bands (see FIG. 6), respectively. For example, FIG. 11B illustrates an RF amplitude increment sequence $\{\Delta\alpha_k\}$ using Kaiser-Bessel window with b1=b2=0.5 (optimized for water frequency, also shown in the lower left side of FIG. 7). Additionally, FIG. 11C illustrates an RF amplitude increment sequence {Δαk} using Kaiser-Bessel window with b1=0, b2=1 (optimized for fat frequency, also shown in the lower left side of FIG. 6).

Measurements and simulations as described with respect to FIGS. 10-13 can be performed using a scanner, such as the one described in FIG. 1. Also, a linear shim can be used to generate a frequency gradient in a uniform spherical ball phantom (T1/T2=150/35). Transient signals after a linear ramp and a Kaiser ramp can be measured in the uniform ball phantom.

A pulse sequence can be designed to optionally catalyze, and acquire the same phase encode for many imaging TRs. The process is repeated for all the phase encoding steps, so that a complete image can be reconstructed for each excitation during the approach to steady-state. One line is extracted from each image to plot the spectral profile evolution during the approach to steady state. The pulse sequence can be designed to wait for thermal equilibrium, apply a multi-step initial preparation sequence, and then acquire the same phase encode for 64 full-cycles.

Measured transient signals can be compared with Bloch simulation in MATLAB (Mathworks, Inc., South Natick, Mass.). Two types of initial preparation can be considered: (1) Linear ramp (shown in FIG. 8) and (2) Kaiser-Bessel ramp preparations (b1, b2 optimized for water band, shown in FIG. 7). Linear and Kaiser-Bessel ramps contain eight pulses (four full-cycles) of 28 ms in length. Two alternating TR SSFP sequences can be considered: (i) wideband SSFP (shown in FIG. 5) and (ii) FS-ATR SSFP (shown in FIGS. 6-7). The prescribed flip angle is 45° in all scans.

FIGS. 12A-B show simulated and measured transient signals from a uniform phantom as functions of number of cycles and resonant frequency. The ATR SSFP sequence that have been considered includes wideband SSFP (see FIG. 12A) and FS-ATR SSFP (see FIG. 12B). The experimental measurements show good agreement with the simulation. The measured spectral profiles are smoother compared to simulated ones because the real phantom reflects a continuous intra-voxel frequency distribution, whereas the simulation is discretely sampled in frequency. This frequency distribution also facilitates the decay of signal oscillation in experiments compared to simulations. Grey arrows indicate the point when central dips become visible. The formation of a central dip in the spectral profile is related to magnetization relaxation, and the central dip begins to form after the sequence reaches a constant flip angle. Hence, the two ramp-up preparation schemes result in a delayed appearance of the dip compared to dummy-cycle preparation.

Initial preparations include eight RF pulses (four full cycles), were 28 ms in length, and include either dummy cycles, linear ramp, or Kaiser-Bessel ramp optimized for the center of the water band. The averaged measured magnitude of oscillation over half of the passband and stopband in the first 10 imaging cycles can be compared based on different preparation schemes. The measured values reflect the magnitude of oscillation relative to the steady-state signal amplitude. In wideband SSFP (see FIG. 12A), the linear ramp reduced the oscillation from 18.7% to 4.6%, and the Kaiser-Bessel ramp preparation further reduced it to 1.8% (the percentage represents the amount of oscillation compared to steady-state magnitude). In FS-ATR SSFP (see FIG. 12B), linear and Kaiser-Bessel ramps optimized for water resonant frequency reduces the amount of oscillation in water band from 41.3% to 1.0% and 0.4%, respectively. The oscillation reduction in fat band is from 48.6% to 9.4% (linear ramp) and 8.3% (Kaiser-Bessel ramp). For both wideband and FS-ATR SSFP sequences, the Kaiser-Bessel ramp creates a better suppression of oscillatory residues and provides a smoother signal transition than the linear ramp.

Figure 13:
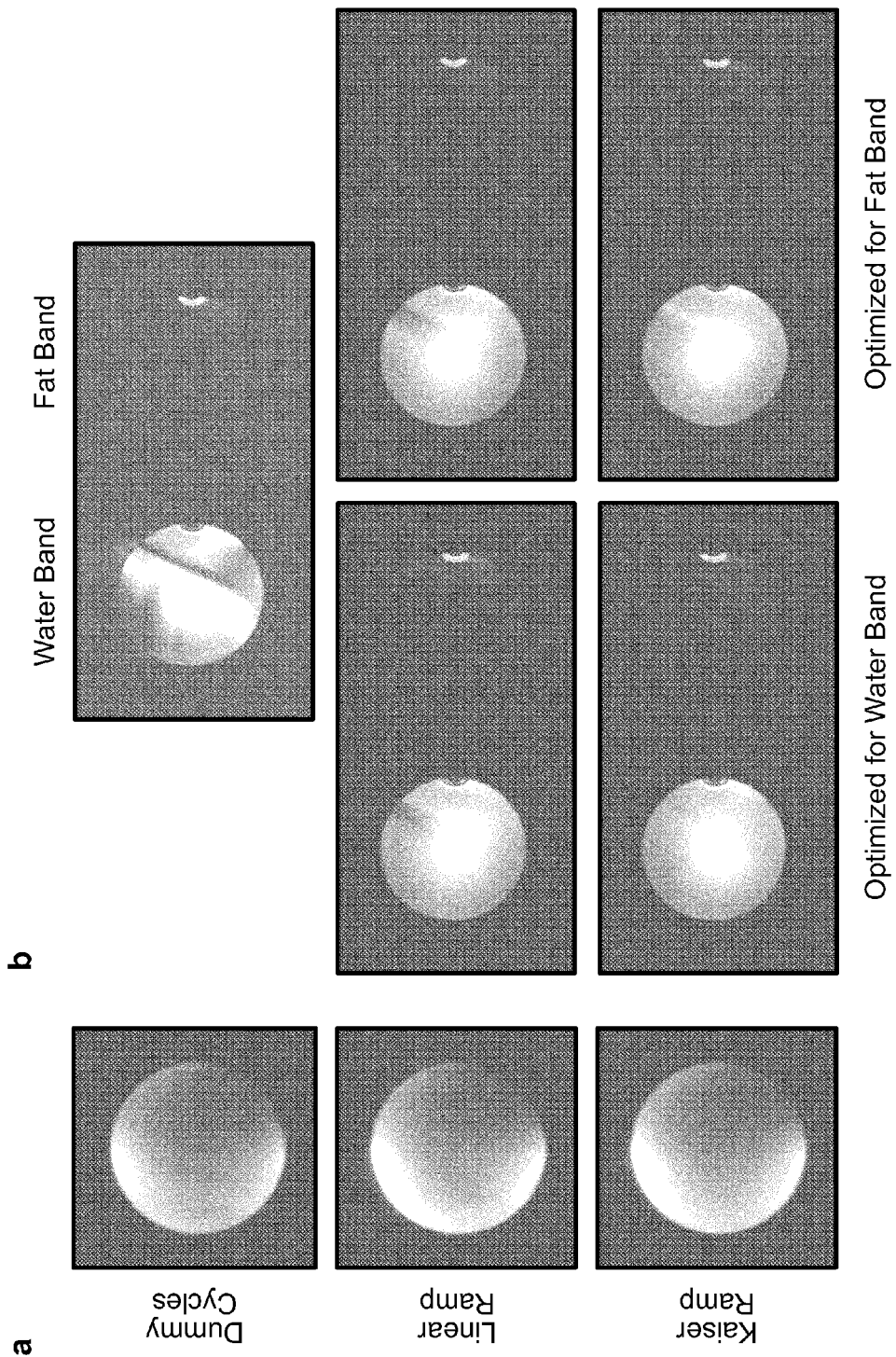

FIG. 13 shows the actual images obtained after different eight step initial preparation schemes. Phantom imaging with eight-step initial preparations and centric phase-encoding ordering can be also performed for wideband SSFP and FS-ATR SSFP sequences to observe the artifacts caused by transient signal oscillation. Three ramp types can be used: dummy cycles, linear ramp, and Kaiser-Bessel windowed ramp. Shim gradients are applied to create a±25 Hz off-resonance span in the uniform ball phantoms. In wideband SSFP experiments the ramps are optimized for the center of passband Δf=0. Ramps optimized for different frequencies are tested in FS-ATR SSFP scans. Two phantoms are imaged with their resonant frequencies centered at water (pass band) and fat (stop band).

As depicted in FIG. 13, images obtained with Kaiser-Bessel windowed ramp have reduced artifacts in both wideband SSFP and FS-ATR SSFP sequences. For example, in FIG. 13B that illustrates FS-ATR SSFP images, initial ramps with different (b1, b2) scalars show slightly more uniform signal and less artifact along the phase-encoding (vertical) direction, around which the frequency bands they are optimized. Furthermore, Kaiser-Bessel windowed ramps optimized for water frequency perform well in the fat band, and the same holds for the opposite case (optimized for fat operated in water).

In such manner, the alternating TR SSFP sequences can be stabilized, and the transient signal fluctuations can be reduced by using the scaled Kaiser-Bessel ramp method as described in this specification.

Notably, the preparation techniques described above provide a ramping-up procedure to reduce transient signal fluctuation in alternating TR SSFP sequences. For example, the Kaiser-Bessel windowed ramp optimized based on the described method can suppress oscillatory residue for a broad range of frequencies. As shown earlier, the scale parameters b1 and b2 may be optimized with respect to the center of passband. The ramp may become slightly less effective as the amount of off-resonance increases. Because the optimized Kaiser-Bessel window has peak concentration around its pass band center and while providing attenuation in the side-lobes, the Kaiser-Bessel window keeps the oscillatory residue suppressed for a wide range of frequencies.

As described above, the result of initial preparation may depend on the shape and ratio of the flip angle increments. The methods described above can be insensitive to variations of B1, the amplitude of the RF pulses. Variations in B1 apply the same scaling to all RF pulses and do not change the relative amplitude of each pulse. Therefore, B1 variation may not have significant effect on the oscillatory residue suppression, which is beneficial in high-field MRI where B1 inhomogeneity is substantial.

The flip angles used in this design are smaller than the flip angle of the imaging sequence. There will be no significant increase in RF power deposition using this initial preparation method. This will help to keep the Specific Absorption Rate (SAR) within safety limit while operation at high field MRI is also associated with increased power absorption and higher local SAR.

In the above description, scale parameters (b1, b2) can be determined by minimizing for one single resonant frequency. Instead of finding the analytical solutions for one frequency, numerical methods can be used to find optimized (b1, b2) for a range of frequencies. By taking the spin frequency distribution of the subject into consideration, the scale parameters (b1, b2) for a range of frequencies may further improve the suppression of transient signal oscillation.

Alternating TR SSFP technique uses two different repetition times to modify the magnetization spectral response. It is possible to use more than two TRs to generate multiple steady-states that improve the spectral response further, e.g., bandwidth wider than 2/TR or better fat suppression. The techniques described in this specification can be generalized to this kind of multiple-TR SSFP sequences and suppress the initial magnetization oscillation.

Implementation of this process can have the following features: Alternating TR SSFP imaging sequence, the ability to set RF amplitude and phase in real-time. The techniques described in this specification provide a model for transient magnetization in alternating TR SSFP. Initial preparation sequences can be designed using a two-step process: first choose a windowing function (for example, a Kaiser-Bessel window), then optimize the (b1, b2) scale parameters by minimizing the oscillatory residue given in Eq. (18). Kaiser-Bessel windowed ramps with scaling factors optimized for wideband SSFP and FS-ATR SSFP were tested in phantom experiments, and the results showed significant reduction of transient signal oscillation in both cases. The proposed design can be applied to any combination of repetition times and RF phase-cycling. The preparation sequences designed in this specification actively reduce oscillatory residues during the transient approach to steady state.

Although a few variations have been described in detail above, other modifications are possible. For example, the logic flow depicted in the accompanying figures and described herein do not require the particular order shown, or sequential order, to achieve desirable results.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations and enhancements of the disclosed implementations and other implementations can be made based on what is described and illustrated in this document.

What is claimed is:

1. A method performed by a magnetic resonance imaging system, the method comprising:
    magnetizing a sample in a uniform magnetic field to orient a portion of nuclear spins to obtain an initial magnetization within the sample;
    conditioning the initial magnetization using a preparation sequence of radio frequency (RF) pulses to reduce a transient oscillation in a select sequence of RF excitation pulses;
    applying the select sequence of RF excitation pulses to flip the conditioned magnetization between a first excited state and a second excited state separated by a predetermined flip angle and a predetermined relative phase;
    detecting spatially-resolved RF emissions from the first and second excited states of the magnetization; and
    converting the detected spatially-resolved RF emissions into an image of the sample.

2. The method of claim 1, wherein the initial magnetization is a thermal equilibrium magnetization.

3. The method of claim 1, further comprising:
    applying a contrast preparation scheme to the initial magnetization prior to conditioning the initial magnetization to prepare the sample for a select application specific imaging, wherein the select application specific imaging comprises fat saturation or inversion recovery.

4. The method of claim 1, wherein the select sequence of RF excitation pulses comprises an alternating repetition time steady-state free precession (ATR SSFP) sequence of pulses comprising different alternating repetition times between the RF excitation pulses.

5. The method as in claim 1, wherein conditioning the initial magnetization comprises:
    iteratively rotating the initial magnetization through a preparatory sequence of angles that incrementally increase from zero to the predetermined flip angle.

6. The method as in claim 5, wherein conditioning the initial magnetization further comprises:
    identifying an expected transient oscillation of the first and second excited states of the magnetization, wherein the transient oscillation is in response to turning on the select sequence of RF excitation pulses in absence of the preparation sequence of RF pulses;
    compensating for the identified transient oscillation comprising:
        applying a scaled window to a set of incremental angles to obtain the preparatory sequence of angles.

7. The method of claim 6, wherein compensating further comprises:
    separating the set of incremental angles in the following:
        a set of odd elements expressed in terms of Kaiser-Bessel (KB) windows multiplied by a first scale parameter, and
        a set of even elements expressed in terms of KB windows multiplied by a second scale parameter; and
    obtaining the first and second scale parameters that add to 1 and to eliminate at least some of the transient oscillation, wherein the first and second scale parameters are based on phase offsets of the first and second excited states of the magnetization, and are independent of the predetermined flip angle.

8. The method of claim 6, wherein identifying the expected transient oscillation comprises:
    obtaining a component of a transient magnetization based on an oscillatory residue comprising a linear combination of the set of incremental angles, the linear combination comprising coefficients that depend on phase offsets of the first and second excited states of the magnetization, and are independent of the predetermined flip angle,
    wherein the component of the transient magnetization is perpendicular to the first and second excited states of the magnetization.

9. A magnetic resonance imaging system comprising:
    a magnet to magnetize a sample in a uniform magnetic field to orient a portion of nuclear spins to obtain an initial magnetization within the sample;
    a controller to obtain a preparation sequence of radio frequency (RF) pulses to reduce a transient oscillation in a select sequence of RF excitation pulses;
    a radio frequency (RF) transceiver in communication with the controller to perform operations comprising:

condition the initial magnetization using the preparation sequence of RF pulses, and apply a select sequence of RF excitation pulses to flip the conditioned magnetization between a first excited state and a second excited state separated by a predetermined flip angle and a predetermined relative phase, and detect spatially-resolved radio frequency emissions from the first and second excited states of the magnetization; and wherein the controller is configured to convert the detected spatially-resolved radio frequency emissions into an image of the sample.

10. The system of claim 9, wherein the initial magnetization is a thermal equilibrium magnetization.

11. The system of claim 9, wherein
the controller is configured to obtain a contrast preparation scheme to condition the initial magnetization to prepare the sample for a select application specific imaging; and
the RF transceiver to apply the contrast preparation scheme, to the initial magnetization prior to conditioning the initial magnetization,
wherein the select application specific imaging comprises fat saturation or inversion recovery.

12. The system of claim 9, wherein the RF transceiver to condition the initial magnetization comprising:
iteratively rotate the initial magnetization through a preparatory sequence of angles that incrementally increase from zero to the predetermined flip angle.

13. The system of claim 9, wherein the select sequence of RF excitation pulses comprises an alternating repetition time steady-state free precession (ATR SSFP) sequence of pulses comprising different alternating repetition times between the RF excitation pulses.

14. The system of claim 13, wherein a first pulse of the ATR SSFP sequence of RF pulses coincides to the last pulse of the sequence of preparatory RF pulses.

15. The system of claim 14, wherein the sequence of preparatory RF pulses comprises an even number of pulses.

16. The system of claim 15, wherein the sequence of preparatory RF pulses comprises 8 pulses.

17. The system as in claim 9, wherein the preparation sequence of RF pulses comprises the repetition times of the select sequence of RF excitation pulses.

18. The system as in claim 12, wherein
the controller is configured to determine the preparatory sequence of angles, comprising
amplitudes of a set of incremental angles selected by applying a window scaled based on scale parameters.

19. The system as in claim 18, wherein the window comprises a Kaiser-Besell window.

20. The system as in claim 9, wherein
the controller is configured to:
identify an expected transient oscillation of the first and second excited states of the magnetization, wherein the transient oscillation is in response to turning on the select sequence of RF excitation pulses in absence of the preparation sequence of RF pulses; and
compensate for the identified transient oscillation comprising:
a scaled window applied to a set of incremental angles to obtain the preparatory sequence of angles.

21. The system of claim 20, wherein
the controller is configured to compensate for the identified transient oscillation comprising:
the set of incremental angles separated in the following:
a set of odd elements expressed in terms of Kaiser-Bessel (KB) windows multiplied by a first scale parameter, and
a set of even elements expressed in terms of KB windows multiplied by a second scale parameter; and
the first and second scale parameters obtained to add to 1 and to eliminate at least some of the transient oscillation, wherein the first and second scale parameters are based on phase offsets of the first and second excited states of the magnetization, and are independent of the predetermined flip angle.

22. The system of claim 20, wherein
the controller is configured to identify the expected transient oscillation comprising:
a component of a transient magnetization obtained based on an oscillatory residue comprising a linear combination of the set of incremental angles, the linear combination comprising coefficients that depend on phase offsets of the first and second excited states of the magnetization, and are independent of the predetermined flip angle,
wherein the component of the transient magnetization is perpendicular to the first and second excited states of the magnetization.

23. The system of claim 21, wherein the select sequence of RF excitation pulses comprises a wideband steady-state free precession (SSFP) pulse sequence; and
wherein the predetermined relative phase comprises $\pi$.

24. The system of claim 23, wherein
the controller is configured to determine the set of incremental angles comprising:
a center of passband set to zero to calculate the first and second scale parameters; and
the set of incremental angles obtained as an alternating scaled KB window, wherein a scale is set by a ratio of the calculated first and second scale parameters.

25. The system of claim 21, wherein the select sequence of RF excitation pulses comprises a fat suppressed ATR SSFP (FS-ATR SSFP) pulse sequence to eliminate fat from an image, wherein the predetermined relative phase is different from 0 and $\pi$.

26. The system of claim 25, wherein
the controller is configured to determine the set of incremental angles comprising:
a center of stopband set to $\pi/2$ to calculate the first and second scale parameters;
the second scale parameter obtained to equal to zero; and
the set of incremental angles obtained to include a KB window comprising odd elements.

27. The system of claim 21, wherein the select sequence of RF excitation pulses comprises an FS-ATR SSFP pulse sequence to image water, wherein the predetermined relative phase is different from 0 and $\lambda$.

28. The system of claim 27, wherein
the controller is configured to determine the set of incremental angles comprising:
a center of passband set to $-\pi/2$ to calculate the first and second scale parameters;
the second scale parameter obtained to equal to the first scale parameter; and
the set of incremental angles obtained to include a KB window comprising odd and even elements.

29. The system of claim 9, wherein the RF transceiver is configured to
detect spatially-resolved radio frequency emissions from the first and second excited states of the magnetization; and simultaneously apply the select sequence of RF excitation pulses.

30. A method for nuclear magnetic resonance imaging (MRI), comprising:
- (a) magnetizing a sample comprising nuclear spins using a principal magnetic field to orient a portion of the nuclear spins;
- (b) applying to the sample a sequence of N radio frequency pulses comprising a time delay after each pulse, the time delay alternating between a first time duration TR1 and a second time duration TR2, a first subset of radio frequency pulses comprising an N/2 radio frequency pulses applied after each of the time delays having the duration TR1, a second subset of radio frequency pulses comprising another N/2 pulses applied after each of the time delays having the duration TR2; and
- (c) rotating, at each of the N radio frequency pulses, at least a portion of the sample magnetization by a rotation angle determined at least in part by parameters of the pulse, the sequence of N radio frequency pulses corresponding to a sequence of N rotation angles, the first subset of radio frequency pulses corresponding to a subset of N/2 rotation angles, the second subset RF pulses corresponding to another subset of N/2 rotation angles, wherein
   - the sequence of N rotation angles are based in part on a Kaiser-Bessel window function and scaled according to scale values,
   - the first subset of rotation angles are scaled by a first scale value (b1), and
   - the second set of rotation angles are scaled by a second scale value (b2) unequal to the first scale value.

31. Instructions stored tangibly in a machine-readable medium, for causing one or more hardware components of a magnetic resonance imaging system to perform operations comprising:
- generate a sequence of N radio frequency pulses comprising a time delay before each pulse, the time delay alternating between a first time duration TR1 and a second time duration TR2, the sequence of N radio frequency pulses parameterized to correspond to a sequence of N rotation angles of a component of a magnetization of a sample, wherein:
   - the sequence of N rotation angles is based in part on a Kaiser-Bessel window function and scaling values,
   - the N/2 radio frequency pulses applied after each of the time delays having the first time duration TR1 are scaled by a first scaling value, and
   - the N/2 radio frequency pulses applied after each of the time delays having the second time duration TR2 are scaled by a second scaling value unequal to the first scaling value.

* * * * *